(12) United States Patent
Otsuka

(10) Patent No.: US 11,304,295 B2
(45) Date of Patent: Apr. 12, 2022

(54) MOUNTING STRUCTURE AND ELECTRONIC DEVICE

(71) Applicant: NEC Corporation, Tokyo (JP)

(72) Inventor: Kyoko Otsuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 17/196,064

(22) Filed: Mar. 9, 2021

(65) Prior Publication Data

US 2021/0289620 A1 Sep. 16, 2021

(30) Foreign Application Priority Data

Mar. 12, 2020 (JP) .............................. JP2020-042717

(51) Int. Cl.
*H05K 1/02* (2006.01)
*H05K 3/30* (2006.01)
*H05K 3/36* (2006.01)

(52) U.S. Cl.
CPC ........... *H05K 1/0281* (2013.01); *H05K 3/303* (2013.01); *H05K 3/363* (2013.01); *H05K 2201/0212* (2013.01); *H05K 2201/10977* (2013.01)

(58) Field of Classification Search
CPC . H05K 1/0277–0283; H05K 3/30–305; H05K 3/361–365
See application file for complete search history.

(56) References Cited

FOREIGN PATENT DOCUMENTS

| JP | 2010-251706 A | 11/2010 |
| JP | 2015-090876 A | 5/2015 |

*Primary Examiner* — Jeremy C Norris
(74) *Attorney, Agent, or Firm* — Sughrue Mion, PLLC

(57) ABSTRACT

In order to provide a mounting structure that has high reliability and easily follows a curved surface, the mounting structure includes a flexible circuit board, a non-flexible component, and a connection portion that is provided in a region smaller than a bottom surface of the non-flexible component and connects the flexible circuit board and the non-flexible component to each other. Further, a protection resin that seals the connection portion in such a way that the flexible circuit board and the non-flexible component are separable from each other outside of the connection portion, is provided. In this configuration, the protection resin covers only a region provided with the connection portion. Thus, the connection portion is mechanically reinforced by the protection resin, and is protected from moisture and dust. Further, on an outside of the connection portion, the flexible circuit board can be bent.

20 Claims, 28 Drawing Sheets

MOUNTING STRUCTURE AND ELECTRONIC DEVICE

This application is based upon and claims the benefit of priority from Japanese Patent Application No. 2020-042717, filed on Mar. 12, 2020, the disclosure of which is incorporated herein in its entirety by reference.

TECHNICAL FIELD

The present invention relates to a mounting structure and an electronic device.

BACKGROUND ART

In recent years, as typified by a wearable device to be worn and used by a person, an electronic device has been often worn on a curved surface. In view of wearing stability and alleviation of uncomfortable feeling due to wearing, it is desirable that such a device worn on a curved surface has flexibility. Meanwhile, most electronic components such as a semiconductor chip, which are used in an electronic device, are rigid, and are damaged when being deformed. Thus, it is desirable that such electronic components be used by being mounted on a non-flexible printed circuit board or the like. Therefore, the above-mentioned electronic device of a type being worn on a curved surface requires a mounting structure of connecting a flexible circuit board and a non-flexible circuit board to each other.

One example of such a mounting structure is disclosed in, for example, PTL 1 (Japanese Unexamined Patent Application Publication No. 2010-251706). In this technique, a land of a flexible substrate having flexibility and a land of a non-flexible printed substrate, which is smaller than the flexible substrate in four directions, are connected to each other with a connection member. Further, an adhesive is applied to a part of the flexible substrate, which surrounds the printed substrate, and attachment on a human body or the like is enabled under a state in which the flexible substrate covers the printed substrate.

Incidentally, in PTL 1, connection portions are exposed, but in a general mounting technique, protection of connection portions is performed by filling a sealing material that is called under-fill in the connection portions on a lower side of a smaller substrate. One example of this structure is disclosed in, for example, PTL 2 (Japanese Unexamined Patent Application Publication No. 2015-090876). PTL 2 discloses a technique of filling an entire lower surface of a chip with the under-fill at a time of flip-chip mounting of a chip on a printed circuit board and preventing excessive under-fill from protruding to outside. In this technique, a partition wall is provided on an outside of a region in which the chip is mounted, and the partition wall has a color having high contrast with respect to solder resist of the printed substrate. Filling of the under-fill is controlled in such a way as to stop when the under-fill arrives at the partition wall, and in the technique of PTL 2, control of a filling amount is facilitated by easily recognizing the partition wall.

SUMMARY

As described above, in the technique of PTL 1, the flexible circuit board and the non-flexible printed circuit board can be connected to each other, but there is a problem that the connection portions are not protected from moisture, dust, and the like. This problem can be solved by using the under-fill as in PTL 2. However, when the technique of filling the entire surface of the non-flexible printed substrate with the under-fill as in PTL 2 is applied to a device of a type being worn on a curved surface, a non-flexible region is disadvantageously formed with having the same size as the non-flexible printed substrate. In such a case, a region that is not bent along a curved surface is increased, and hence there is a problem that a gap is formed between the device and a wearing surface, which causes wearing unstability. Further, in a case of a wearable device, there is also a problem that a user has uncomfortable feeling.

The present invention has been made in view of the above-mentioned problems, and an object thereof is to provide a mounting structure that has high reliability and easily follows a curved surface.

In order to solve the above-mentioned problems, a mounting structure includes a flexible circuit board, a non-flexible component, and a connection portion that is provided in a region smaller than a bottom surface of the non-flexible component and connects the flexible circuit board and the non-flexible component to each other. Further, a protection resin that seals the connection portion in such a way that the flexible circuit board and the non-flexible component are separable from each other outside of the connecting portion is provided. In this configuration, the protection resin covers only a region provided with the connection portion. Thus, the connection portion is mechanically reinforced by the protection resin, and is protected from moisture and dust. Further, on an outside of the connection portion, the flexible circuit board can be bent.

An advantageous effect of the present invention is that the mounting structure that has high reliability and easily follows a curved surface is able to be provided.

BRIEF DESCRIPTION OF THE DRAWINGS

Exemplary features and advantages of the present invention will become apparent from the following detailed description when taken with the accompanying drawings in which.

EXAMPLE EMBODIMENT

With reference to the drawings, example embodiments of the present invention are described in detail below. However, in the example embodiments described below, limitations that are technically preferable for carrying out the present invention are given, the scope of the invention is not limited to below. Note that, similar constituent elements in each drawing are denoted with the same numerals, and description thereof is omitted in some cases.

First Example Embodiment

Figure 1:
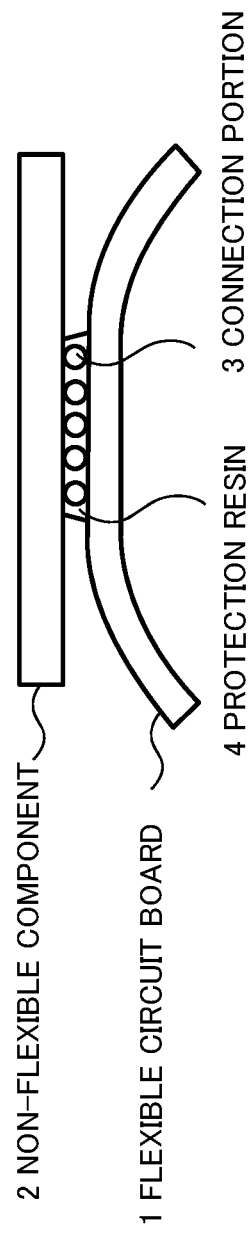
FIG. 1 is a cross-sectional view illustrating a mounting structure according to a first example embodiment.

FIG. 1 is a cross-sectional view illustrating a mounting structure 10 according to the present example embodiment. The mounting structure 10 includes a flexible circuit board 1, a non-flexible component 2, and connection portions 3 that are provided in a region smaller than a bottom surface of the non-flexible component 2 and connects the flexible circuit board 1 and the non-flexible component 2 to each other. Further, in addition to the connection portions 3, a protection resin 4 that seals the connection portions 3 in such a way that the flexible circuit board 1 and the non-flexible component 2 are separable from each other outside of the connecting portion is provided. In this configuration, the protection resin 4 covers only a region provided with the connection portions 3. As a result, the connection portions 3 are mechanically reinforced by the protection resin, and are protected from moisture and dust. Further, on an outer side, the flexible circuit board 1 can be bent.

With the configuration described above, the mounting structure having high reliability of the connection portion, the small non-flexible region, and the large flexible region can be manufactured. By utilizing those features, the mounting structure that has high reliability and easily follows a curved surface can be provided.

Second Example Embodiment

Figure 2:
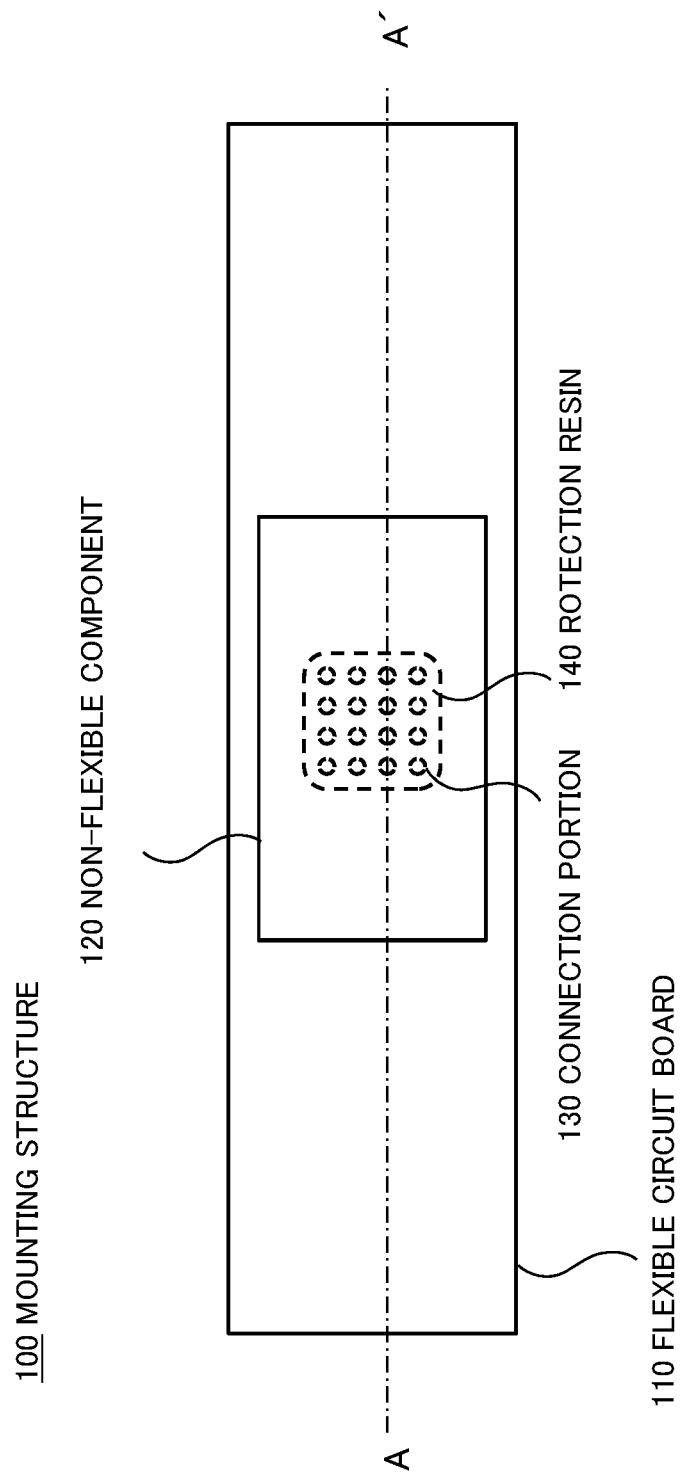
FIG. 2 is a plan view illustrating a mounting structure according to a second example embodiment.

FIG. 2 is a plan view illustrating a mounting structure 100 according to the present example embodiment. The mounting structure 100 includes a flexible circuit board 110 and a non-flexible component 120. Further, on a bottom surface of the non-flexible component (a surface facing the flexible circuit board 110), connection portions 130 that connect the flexible circuit board 110 and the non-flexible component 120 to each other are provided in a region smaller than the bottom surface. Further, a protection resin 140 is provided in such a way as to cover only the region in which the connection portions 130 exist.

Figure 3:
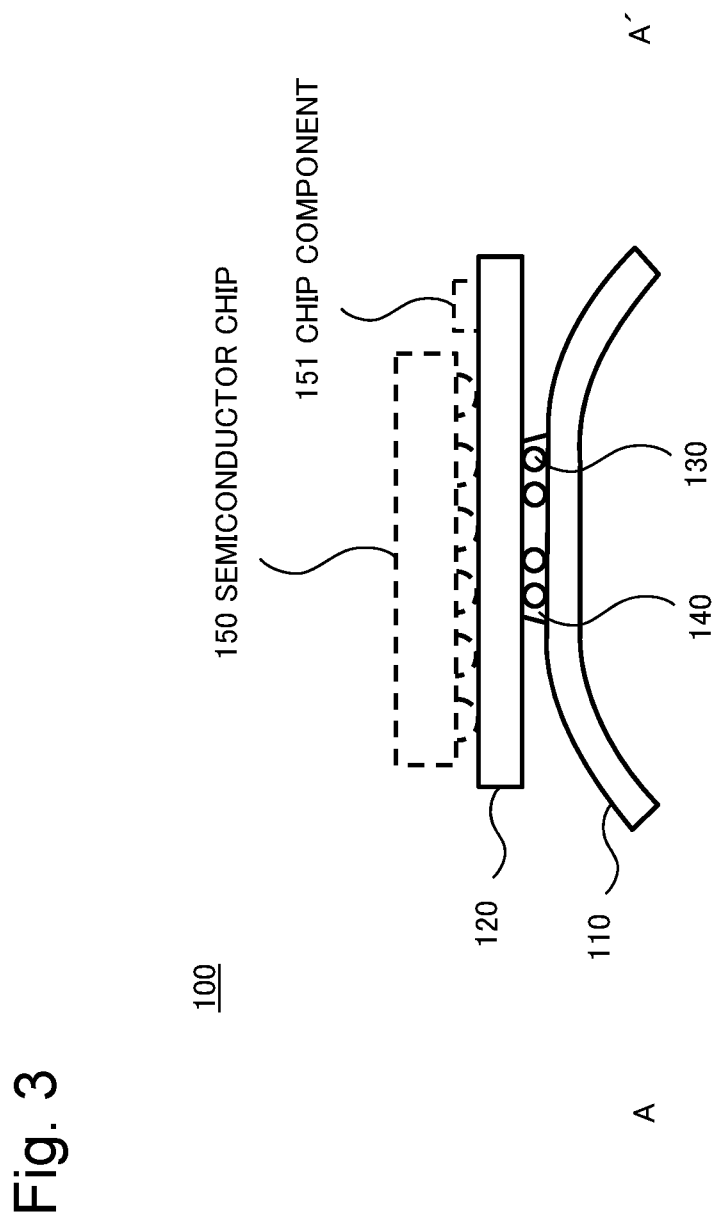
FIG. 3 is a cross-sectional view illustrating the mounting structure according to the second example embodiment.

FIG. 3 is a cross-sectional view taken along a line A-A' in FIG. 2. The connection portions 130 connect the flexible circuit board 110 and the non-flexible component 120 to each other, and the protection resin 140 covers the connection portions 130. A region in which the connection portions 130 and the protection resin 140 exist is smaller than the bottom surface of the non-flexible component 120. Further, on an outside of the region, the flexible circuit board 110 is separable from the non-flexible component 120, and can be bent. A type of the non-flexible component 120 is optional, and, for example, may be a semiconductor chip 150 or a printed circuit board equipped with a chip component 151 as illustrated in FIG. 3. In addition, another component that includes connection portions in a region smaller than the bottom surface may be provided.

Figure 4:
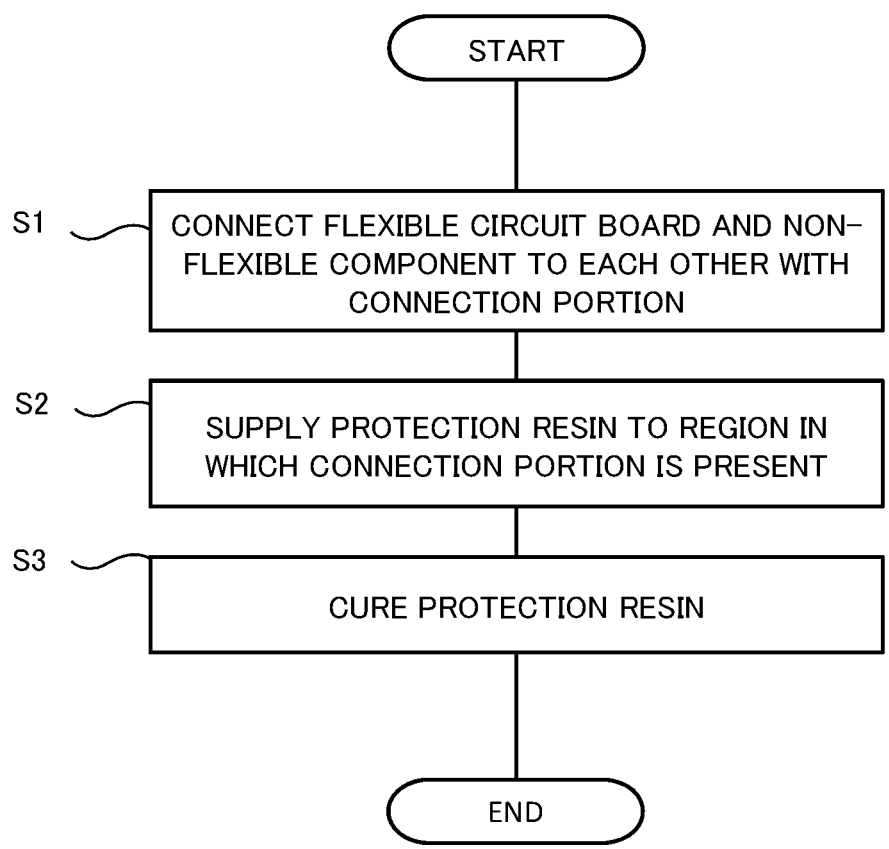
FIG. 4 is a flowchart illustrating a manufacturing method of a mounting structure according to the second example embodiment.

FIG. 4 is a flowchart illustrating a manufacturing method of a mounting structure. First, a flexible circuit board and a non-flexible component are connected to each other with the connection portions (S1). A connecting method is determined depending on a type of an electrode of each substrate, and connection may be performed by, for example, using solder or a solder bump when both of the electrodes are copper. Subsequently, in a region in which the connection portions are present, the protection resin is supplied by an amount sufficient for covering only the region in which the connection portions are present (S2). For example, an epoxy-based or silicone-based sealing material being a general under-fill material may be used as the protection resin, but the protection resin is not limited thereto. Subsequently, the protection resin is cured, and the mounting structure is completed (S3). A curing method depends on the protection resin to be used, and may be performed by thermosetting under a predetermined condition in a case of, for example, a thermosetting resin.

As described above, with the configuration of the present example embodiment, the non-flexible range of the mounting structure 100 can be limited to the region that is smaller than the bottom surface of the non-flexible component 120 and is provided with the protection resin 140, and the flexible circuit board 110 can be bent in a region on the outer side. Thus, the non-flexible region of the mounting structure as a whole can be reduced. As a result, in a wearable device, followability to a wearing surface such as a human body can be improved. This feature is suitable for a wearable device because a user is less likely to feel uncomfortable.

Third Example Embodiment

Figure 5:
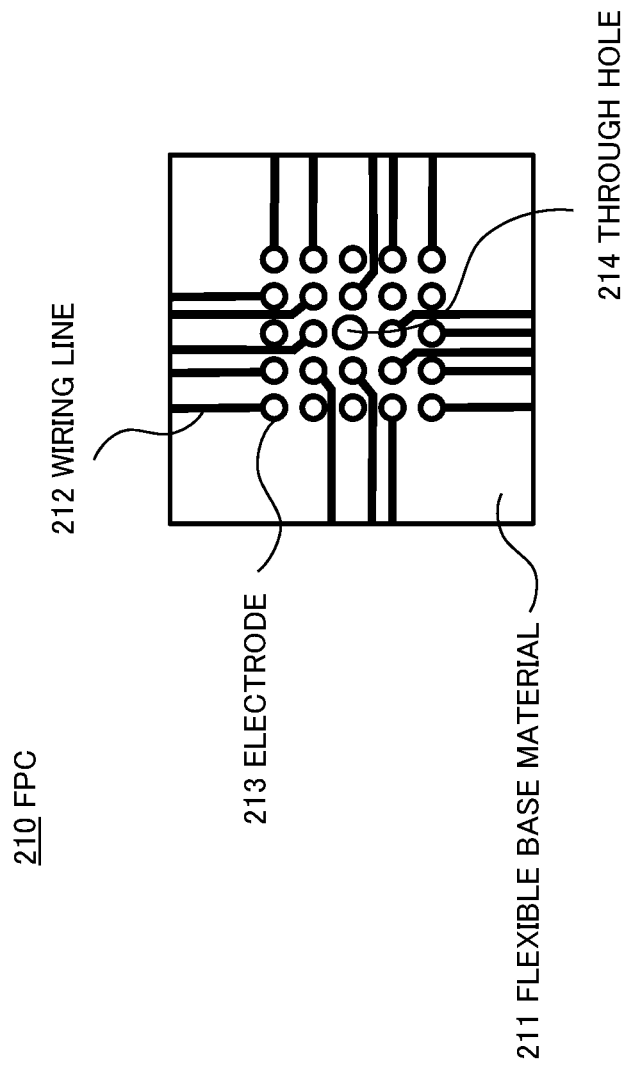
FIG. 5 is a plan view illustrating an FPC used in an electronic device according to a third example embodiment.

FIG. 5 is a plan view illustrating a flexible printed circuit (FPC) board 210 being one type of the flexible circuit board used in the present example embodiment. In the FPC 210, a flexible base material 211 is provided with wiring lines 212 and electrodes 213. The electrodes 213 are provided in association with electrodes of a non-flexible component to be connected. A region provided with the electrodes 213 is within a range smaller than a counter surface of the non-flexible component to be connected. Further, in the vicinity of the center of the region provided with the electrodes 213, a through hole 214 passing through the flexible base material 211 is provided.

Figure 6:
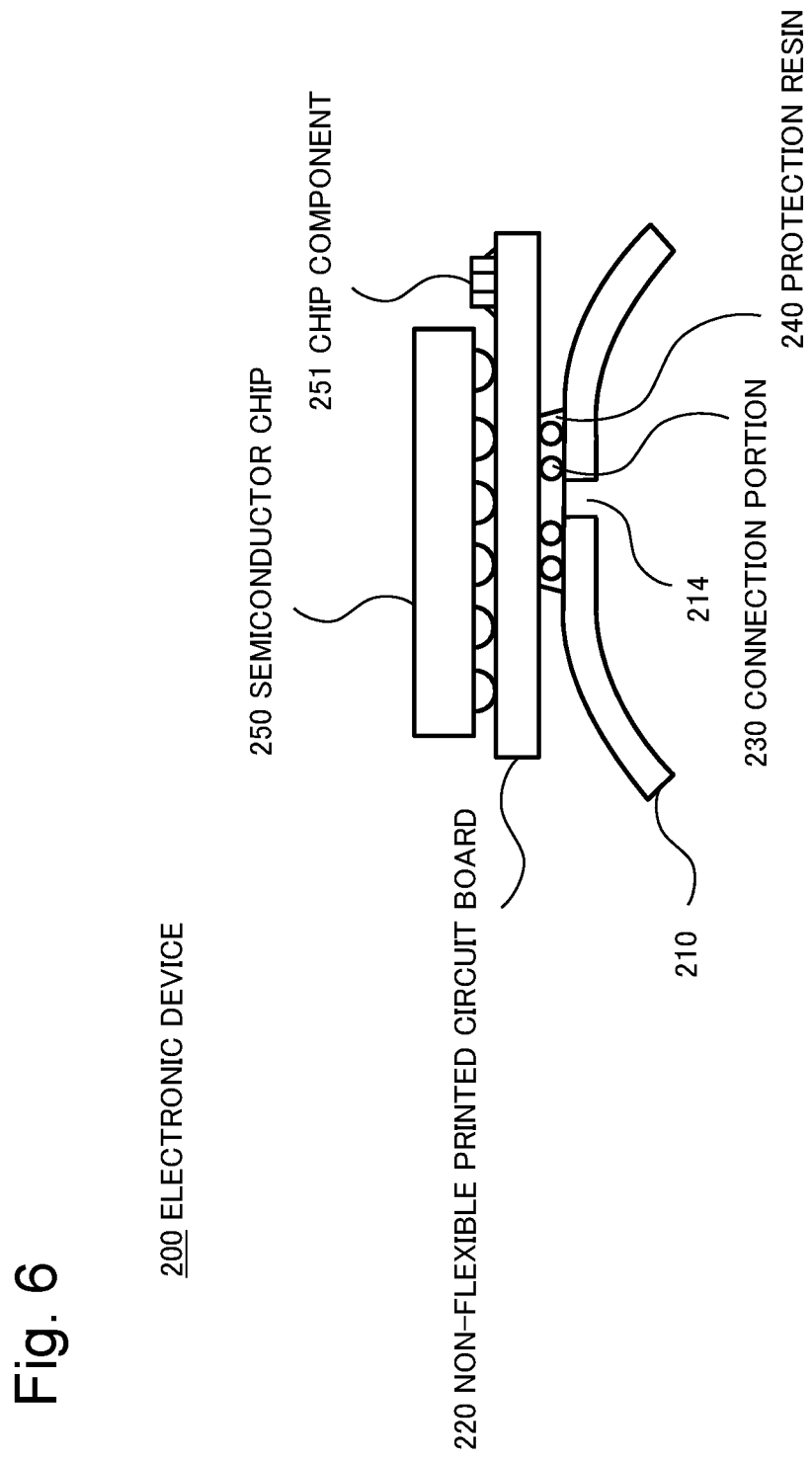
FIG. 6 is a cross-sectional view illustrating the electronic device according to the third example embodiment.

FIG. 6 is a cross-sectional view illustrating an electronic device 200 in which a non-flexible printed circuit board 220 being one type of the non-flexible component and the FPC in FIG. 5 are connected to each other. In the electronic device 200, similarly to the first example embodiment, a region smaller than a bottom surface of the non-flexible printed circuit board 220 is provided with connection portions 230, and the FPC 210 can be bent on the outside of the connection portions 230. Note that, here is exemplified a configuration in which the non-flexible printed circuit board 220 is mounted with a semiconductor chip 250 and a chip component 251.

Note that the above-mentioned description is given by exemplifying the configuration in which the FPC 210 includes the through hole 214, and a configuration of providing a through hole in the non-flexible printed circuit board 220 is similarly achieved.

In the present example embodiment, injection of a protection resin 240 between the connection portions 230 is performed through the through hole 214. In this manner, the protection resin 240 is injected from the vicinity of the center of the region provided with the connection portions 230, and hence a distance to the connection portions 230 that is farthest from the injection spot is reduced, and filling of the protection resin 240 can be performed without generating a void.

Fourth Example Embodiment

Figure 7:
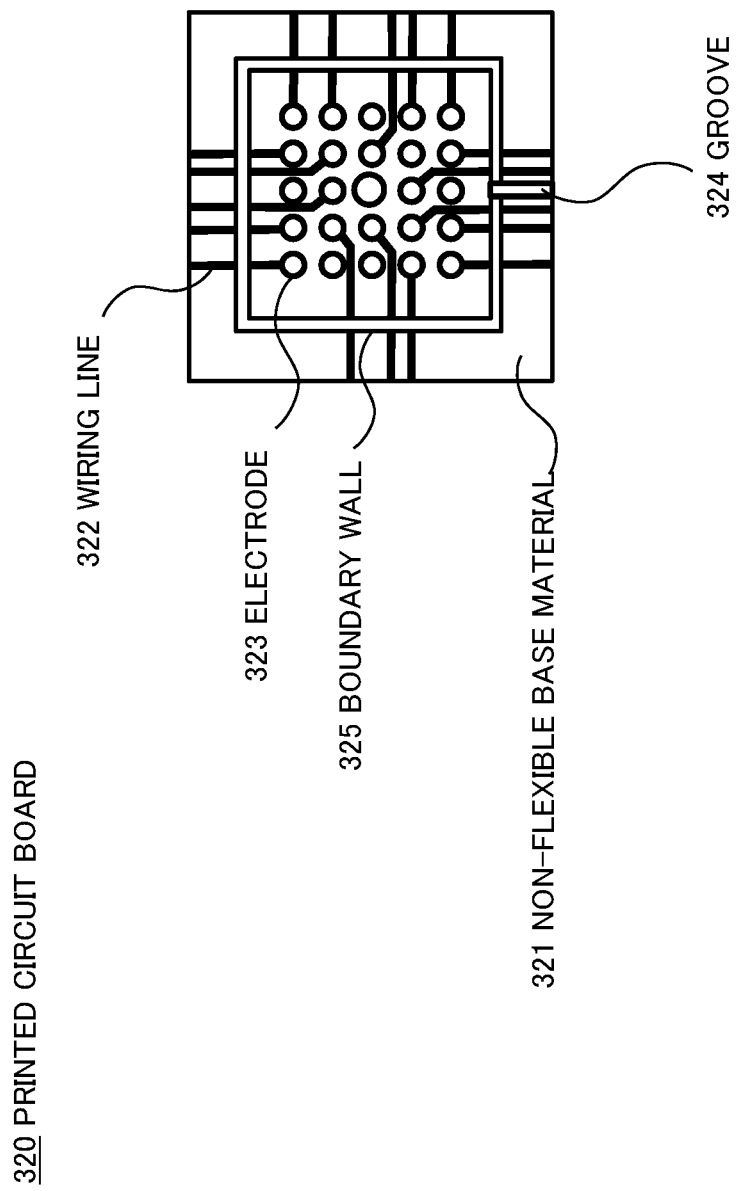
FIG. 7 is a plan view illustrating a printed circuit board used in an electronic device according to a fourth example embodiment.

FIG. 7 is a plan view illustrating a printed circuit board 320 being one type of the non-flexible component, which is used in the present example embodiment. The printed circuit board 320 includes a non-flexible base material 321, wiring lines 322, and electrodes 323. The electrodes 323 are provided in association with electrodes of a FPC to be connected. A region provided with the electrodes 323 is within a range smaller than a bottom surface of the printed circuit board 320. Further, in one side of the non-flexible base material 321, a groove 324 that extends from an end of the side to the vicinity of the region provided with the electrodes 323 is provided. Further, a boundary wall 325 is provided in such a way as to surround the region provided with the electrodes 323. The boundary wall 325 protrudes from the surface of the non-flexible base material 321. The height is set to be, for example, smaller than an interval between the printed circuit board 320 and an FPC when both the components are connected to each other. The boundary wall 325 can be formed by using, for example, a photosensitive resin.

Figure 8:
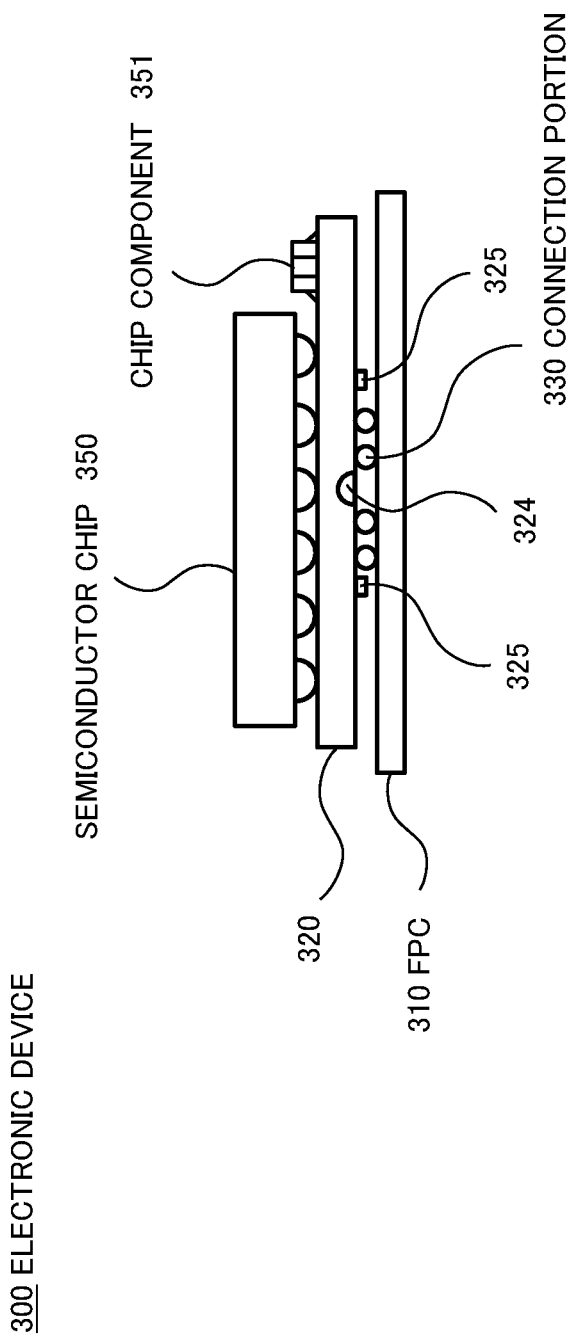
FIG. 8 is a cross-sectional view illustrating one example of the electronic device according to the fourth example embodiment.

FIG. 8 is a cross-sectional view illustrating an electronic device 300 in which the printed circuit board 320 in FIG. 7 and an FPC 310 are connected to each other. In the electronic device 300, similarly to the first and second example embodiments, a region smaller than the bottom surface of the non-flexible printed circuit board 320 is provided with connection portions 330, and the FPC 310 can be bent on the outside of the connection portions 330. Note that, here is exemplified a configuration in which the non-flexible printed circuit board 320 is mounted with a semiconductor chip 350 and a chip component 351.

In the present example embodiment, injection of a protection resin 340 in a space between the connection portions 330 is performed through the groove 324. In this manner, by a capillary phenomenon, the protection resin 340 percolates through the groove 324 to the space between the connection portions 330 and the connection portions 330, and the space between the connection portions 330 can be filled with the protection resin 340 without a void. Further, when the boundary wall 325 is provided, the boundary wall 325 hinders an advance of the protection resin, and hence the protection resin can be prevented from protruding to the outside of the boundary wall 325. A region without flexibility is increased as the protection resin spreads, which can be avoided by the boundary wall 325. Note that both configurations provided with and without the boundary wall 325 can be used.

Figure 9:
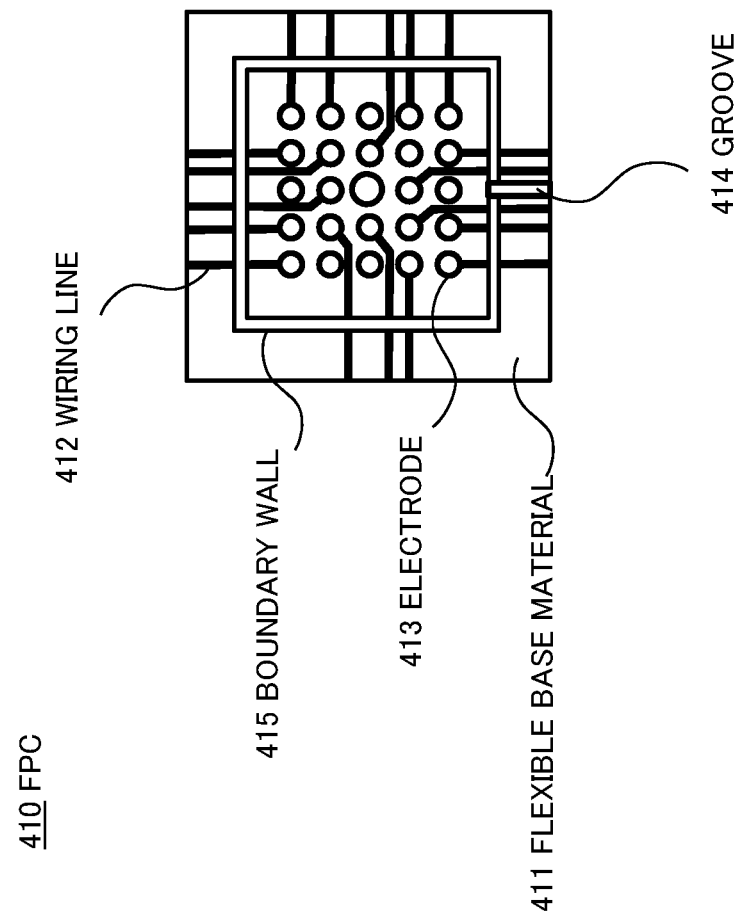
FIG. 9 is a plan view illustrating an FPC used in the electronic device according to the fourth example embodiment.

In the above-mentioned configurations in FIGS. 7 and 8, the groove 324 and the boundary wall 325 are provided to the non-flexible base material 321, but may be provided to an FPC. FIG. 9 is a plan view illustrating a flexible FPC 410 used in this configuration, which is used in the present example embodiment. The FPC 410 includes a flexible base material 411, wiring lines 412, and electrodes 413. The electrodes 413 are provided in association with electrodes of a non-flexible component to be connected. A region provided with the electrodes 413 is within a range smaller than a bottom surface of the non-flexible component. Further, in one side of the flexible base material 411, a groove 414 that extends from an end of the side to the vicinity of the region provided with the electrodes 413 is provided. Further, a boundary wall 415 is provided in such a way as to surround the region provided with the electrodes 413. The boundary wall 415 protrudes from the surface of the flexible base material 411. The height is set to be, for example, smaller than an interval between the FPC 410 and a non-flexible component when both the components are connected to each other. The boundary wall 415 can be formed by using, for example, a photosensitive resin.

Figure 10:
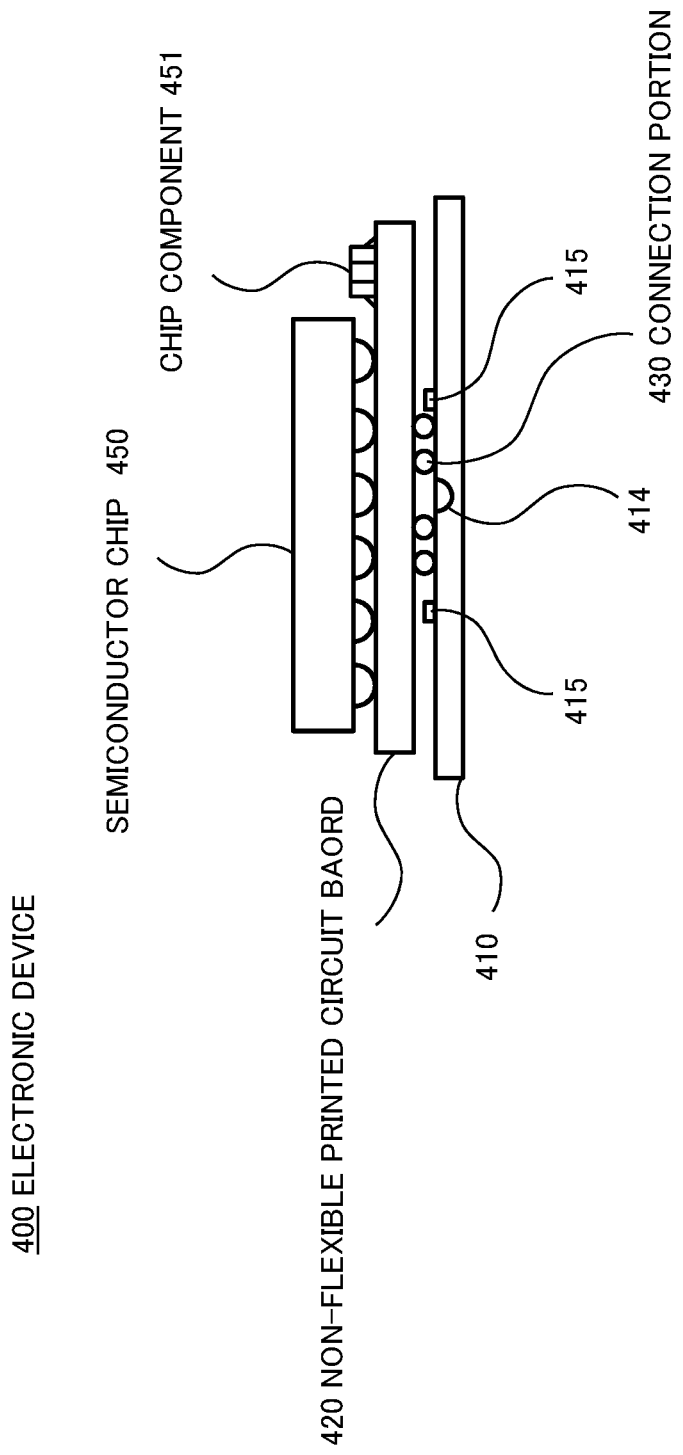
FIG. 10 is a cross-sectional view illustrating another example of the electronic device according to the fourth example embodiment.

FIG. 10 is a cross-sectional view illustrating an electronic device 400 in which the FPC 410 in FIG. 9 and a non-flexible printed circuit board 420 are connected to each other. In the electronic device 400, similarly to the third example embodiment, a region smaller than the bottom surface of the non-flexible printed circuit board 420 is provided with connection portions 430, and the FPC 410 can be bent on the outside of the connection portions 430. Note that, here is exemplified a configuration in which the non-flexible printed circuit board 420 is mounted with a semiconductor chip 450 and a chip component 451.

In the present example embodiment, injection of a protection resin 440 in a space between the connection portions 430 is performed through the groove 414. In this manner, by a capillary phenomenon, the protection resin percolates through the groove 414 to the space between the connection portions 430 and the connection portions 430, and the space between the connection portions 430 can be filled with the protection resin 440 without a void. Further, when the boundary wall 415 is provided, the boundary wall 415 hinders an advance of the protection resin, and hence the protection resin can be prevented from protruding to the outside of the boundary wall 415. A region without flexibility is increased as the protection resin spreads, which can be avoided by the boundary wall 415. Note that both configurations provided with and without the boundary wall 415 can be used.

As described above, according to the present example embodiment, the electronic device in which the protection resin can effectively fill a space between the connection portions and protruding of the protection resin to the outside of the connection portions is little can be configured.

Fifth Example Embodiment

A general FPC is formed of a base material being a plastic film such as polyimide and polyethylene terephthalate (PET). These materials are semi-transparent, and hence a filling condition of the protection resin can be visually recognized through the base material when the FPC and an electronic component is connected to each other and the protection resin fills a space between the connection portions. However, when a plurality of FPCs are layered, sufficient light cannot pass through, and hence it is difficult to observe a filling condition of the protection resin from the outside. In the present example embodiment, description is made on a configuration enabling observation of a filling condition of the protection resin even in this case.

Figure 11:
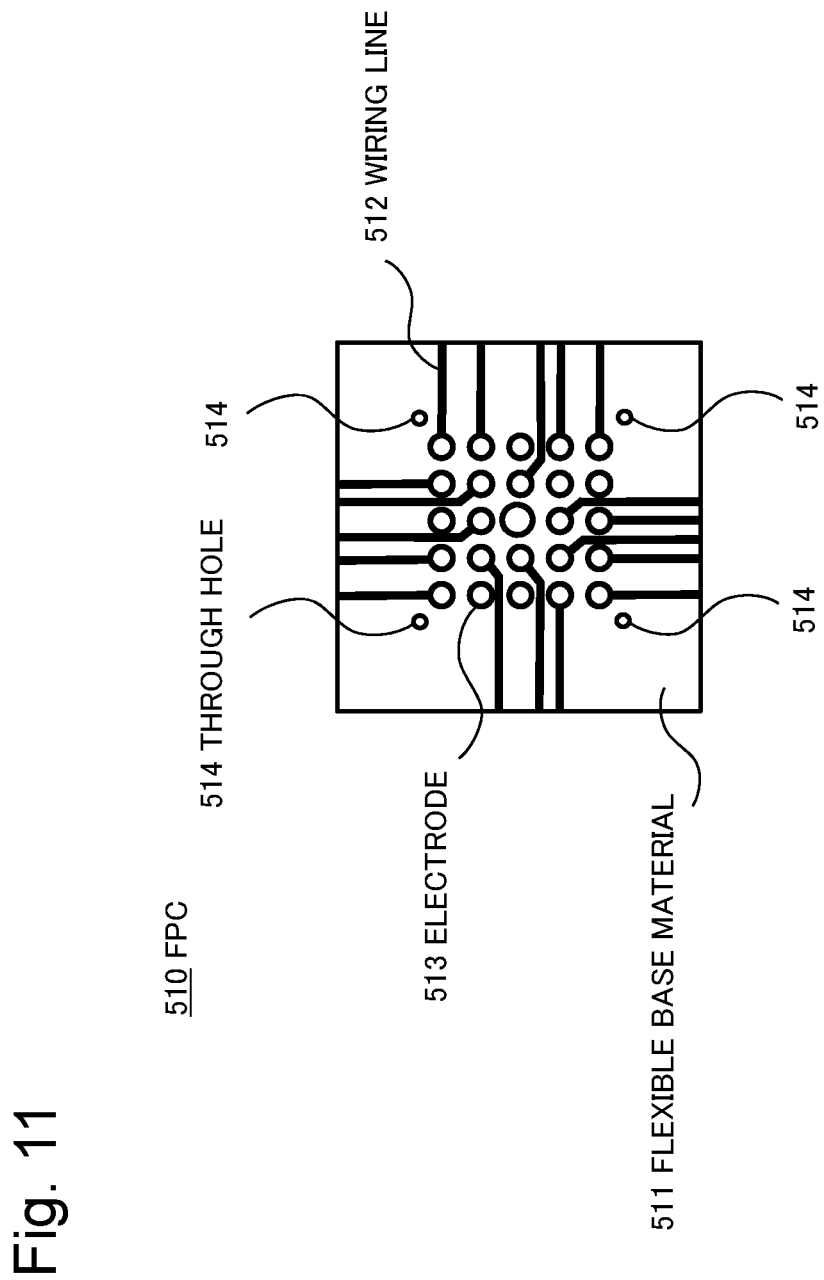
FIG. 11 is a plan view illustrating an FPC used in an electronic device according to a fifth example embodiment.

FIG. 11 is a plan view illustrating an FPC 510 used in an electronic substrate of the present example embodiment. The FPC 510 includes a flexible base material 511, wiring lines 512, and electrodes 513. The electrodes 513 are provided in association with a non-flexible component to be connected. A region provided with the electrodes 513 is within a range smaller than a bottom surface of the non-flexible component. Further, on an outside of a region provided with the electrodes 513 of the flexible base material 511, through holes 514 are provided. The through holes 514 pass through the flexible base material 511. In the example in FIG. 11, the region provided with the electrodes 513 has a rectangular shape, and the through holes 514 are provided on the outside of the vicinities of the four corners.

Figure 12:
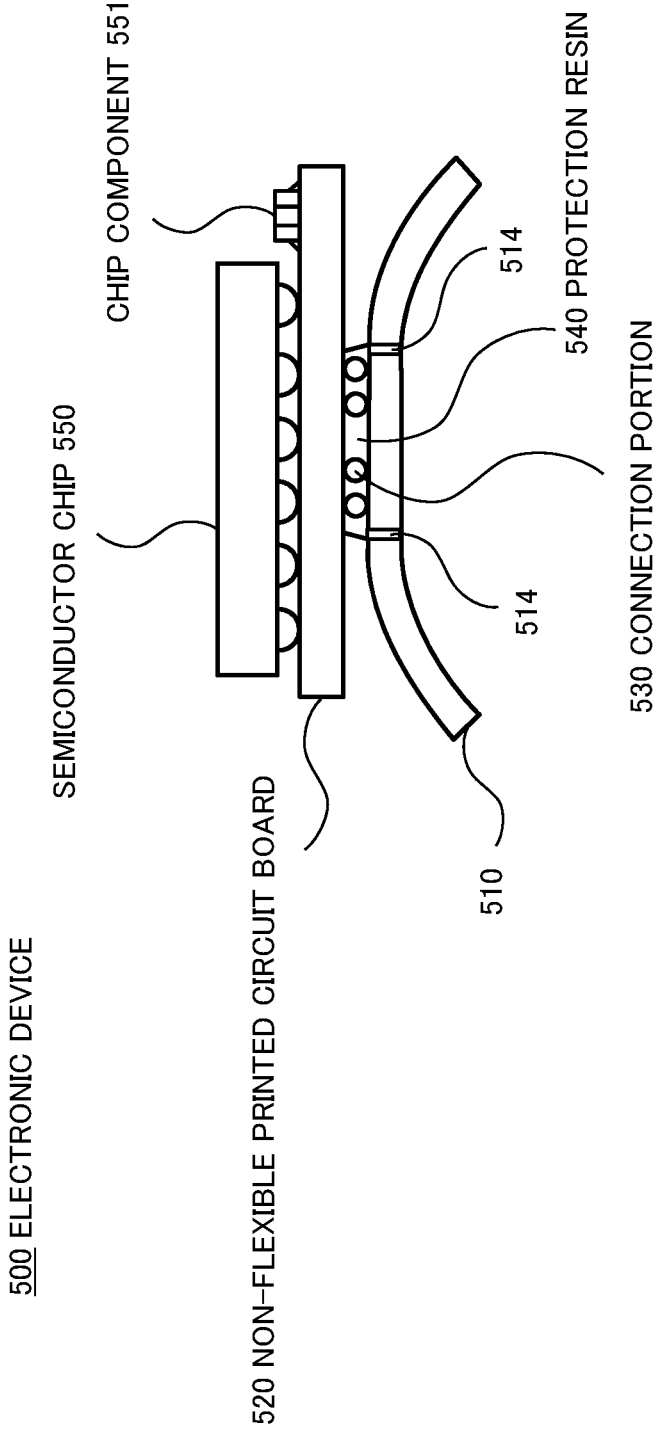
FIG. 12 is a cross-sectional view illustrating one example of the electronic device according to the fifth example embodiment.

FIG. 12 is a cross-sectional view illustrating an electronic device 500 in which the FPC 510 in FIG. 11 and a non-flexible printed circuit board 520 are connected to each other. In the electronic device 500, similarly to the third and fourth example embodiments, a region smaller than a bottom surface of the non-flexible printed circuit board 520 is provided with connection portions 530, and the FPC 510 can be bent on the outside of the connection portions 530. Note that, here is exemplified a configuration in which the non-flexible printed circuit board 520 is mounted with a semiconductor chip 550 and a chip component 551.

In the present example embodiment, injection of a protection resin 540 in a space between the connection portions 530 is performed, for example, from the outside of the formation region of the connection portions 530. The protection resin 540 percolates to the space between the connection portion 530 and the connection portion 530 by a capillary phenomenon. The protection resin 540 fills the region provided with the connection portions 530 and spreads to the outside of the region, and then the protection resin 540 is observed through the through holes 514. Further, here, for example, when supply of the protection resin 540 is stopped, the protection resin can be prevented from spreading more than necessary. The protection resin 540 is required to cover the entire connection portions 530. However, when the protection resin 540 spreads to the outside of the region provided with the connection portions 530, a non-flexible region is increased, which reduces an effect of increasing a flexible region. Note that, in a case where the FPC 510 has a though hole, when an air bubble is mixed in the protection resin, gas can be discharged through the through hole, which can exert an effect that a void is less likely to be generated.

Figure 13:
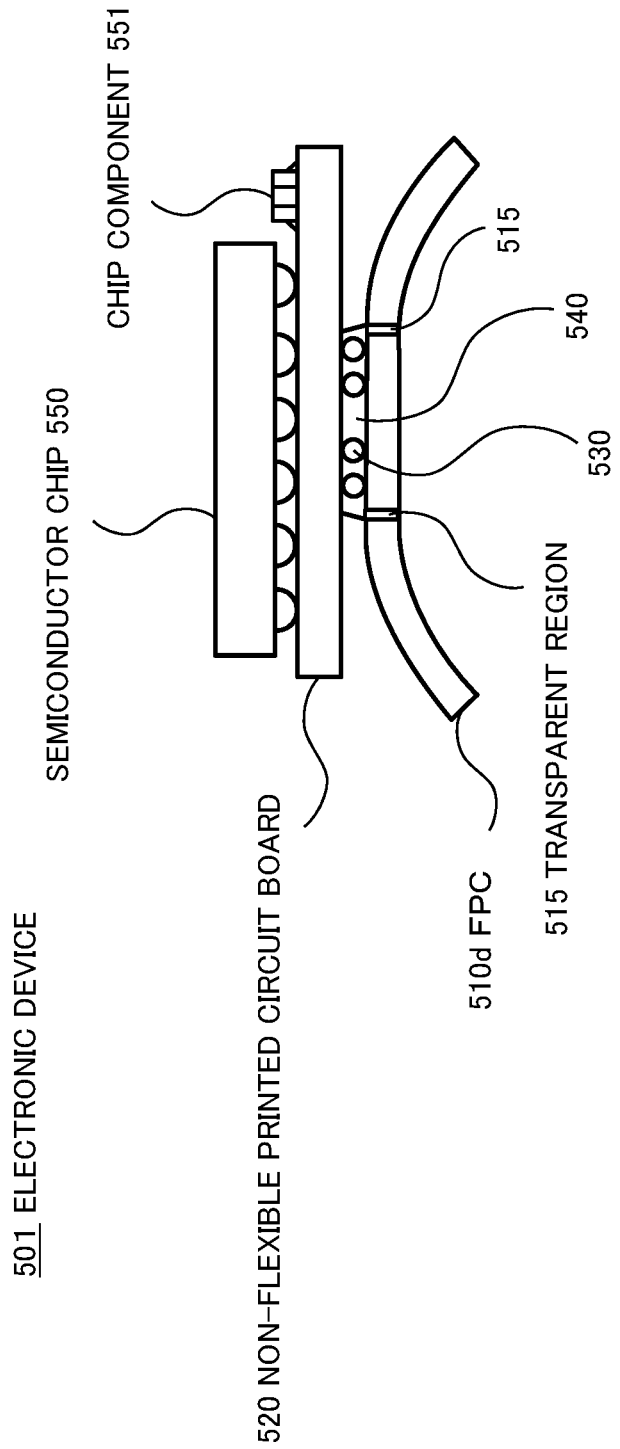
FIG. 13 is a cross-sectional view illustrating another example of the electronic device according to the fifth example embodiment.

For the purpose of observing spreading of the protection resin, a transparent region may be provided in place of the through hole. FIG. 13 is a cross-sectional view illustrating an electronic device 501 using an FPC 510d provided with transparent regions 515 at positions associated with the through holes 514 in FIG. 12. A configuration of the electronic device 501 is the same as that of the electronic device 500 in FIG. 12 except that the through holes 514 are replaced with the transparent regions 515. Thus, repetitive description is omitted. For example, when the protection resin 540 is injected from the outside of the formation region of the connection portions 530, the protection resin 540 percolates to the space between the connection portion 530 and the connection portion 530 by a capillary phenomenon. The protection resin 540 fills the region provided with the connection portions 530 and spreads to the outside of the region, and then the protection resin 540 is observed through the transparent regions 515. Further, here, for example, when supply of the protection resin 540 is stopped, the protection resin can be prevented from spreading more than necessary.

Figure 14:
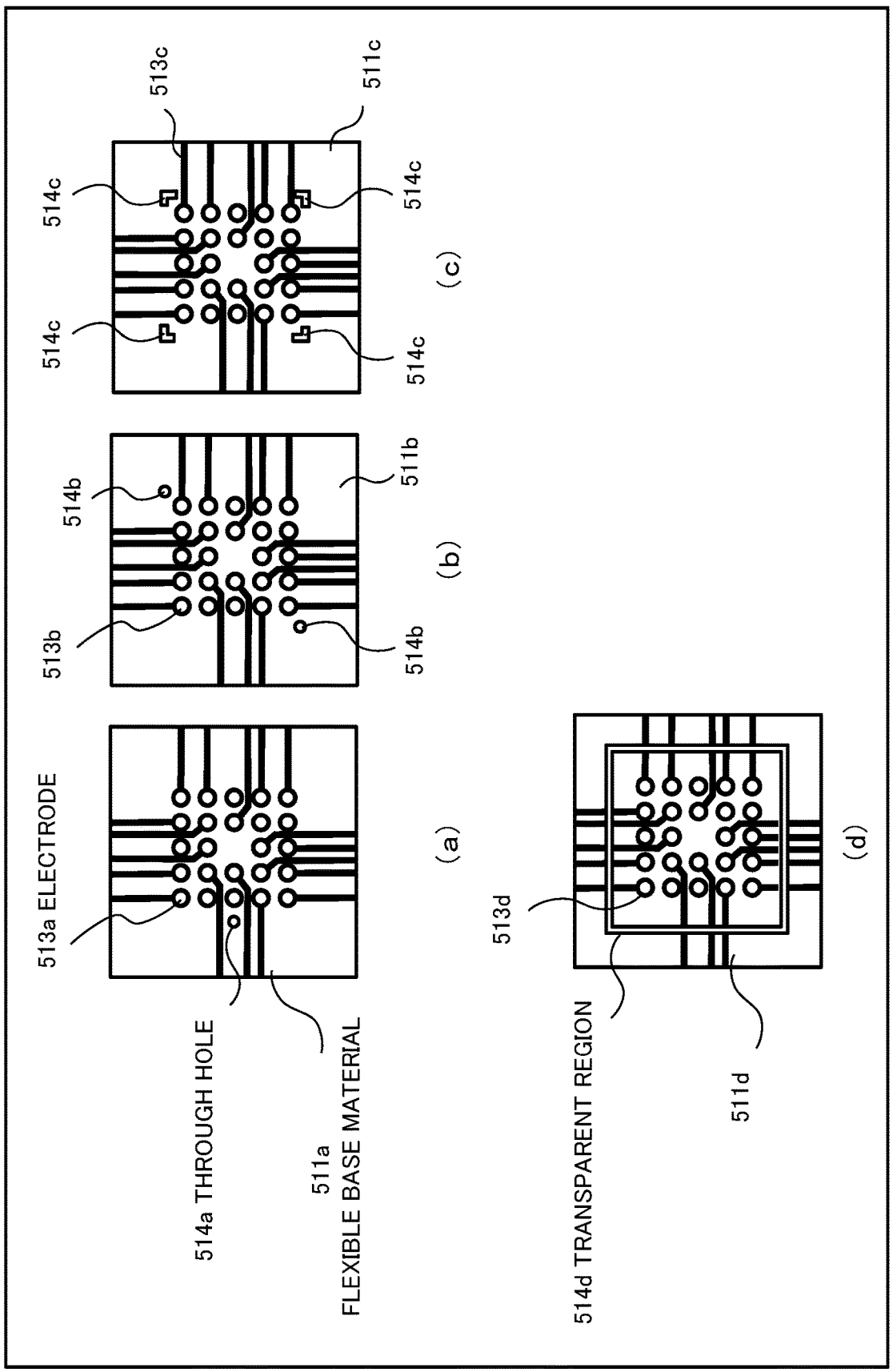
FIG. 14 is a plan view illustrating specific examples of an FPC used in the electronic device according to the fifth example embodiment.

FIG. 14 is a plan view illustrating arrangement examples of the through holes or a transparent region on the FPC. In an example of (a) of FIG. 14, a flexible base material 511a has one through hole 514a on an outside of a region provided with electrodes 513a. In an example of (b) of FIG. 14, a flexible base material 511b has through holes 514b on outsides of two opposite corners of a rectangle region provided with electrodes 513b. In an example of (c) of FIG. 14, a flexible base material 511c has L-shaped through holes 514c on outsides of four corners of a rectangle region provided with electrodes 513c. Note that a configuration of replacing those through holes with a transparent region may be employed. In an example of (d) of FIG. 14, a flexible base material 511d has a quadrangular transparent region 515 surrounding a rectangle region provided with electrodes 513d. Note that, when the transparent region 515 in (d) of FIG. 14 is replaced with through holes, an inside and an outside of the flexible base material 511d are separated from each other, and hence this configuration is not applicable to through holes.

The above-mentioned description is given by exemplifying the configuration in which the FPC 510 has the through holes 514 and the transparent region 515, and similar effects can be acquired even when a configuration in which the non-flexible printed circuit board 520 has through holes and transparent regions provided is employed.

As described above, according to the present example embodiment, a filling condition of the protection resin can be observed, and a filling range of the protection resin can be controlled accurately.

Sixth Example Embodiment

Figure 15:
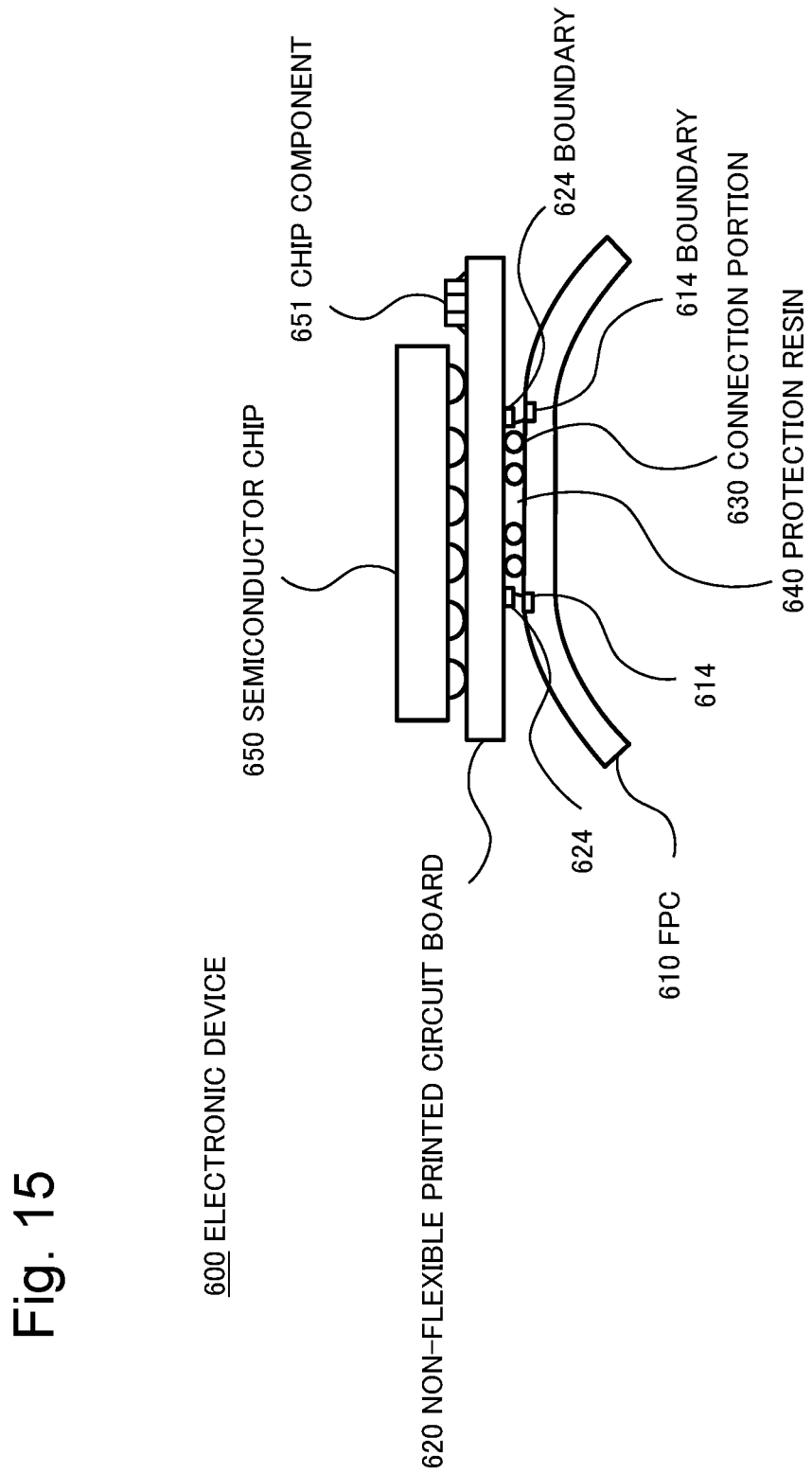
FIG. 15 is a cross-sectional view illustrating one example of an electronic device according to a sixth example embodiment.

In the fifth example embodiment, a filling amount of the protection resin is controlled in such a way as to suppress unnecessary spreading of a protection resin, but spreading of the protection resin may be hindered physically. FIG. 15 is a cross-sectional view illustrating an electronic device 600 in which an FPC 610 provided with a boundary 614 that hinders an advance of a protection resin 640 and a non-flexible printed circuit board 620 similarly provided with a boundary 624 are connected to each other with connection portions 630. Each of the boundary 614 and the boundary 624 is a protrusion portion surrounding a region provided with the connection portions 630. Each of the heights is set to be smaller than an interval between the FPC 610 and the non-flexible printed circuit board 620 at the connection portions.

Figure 16:
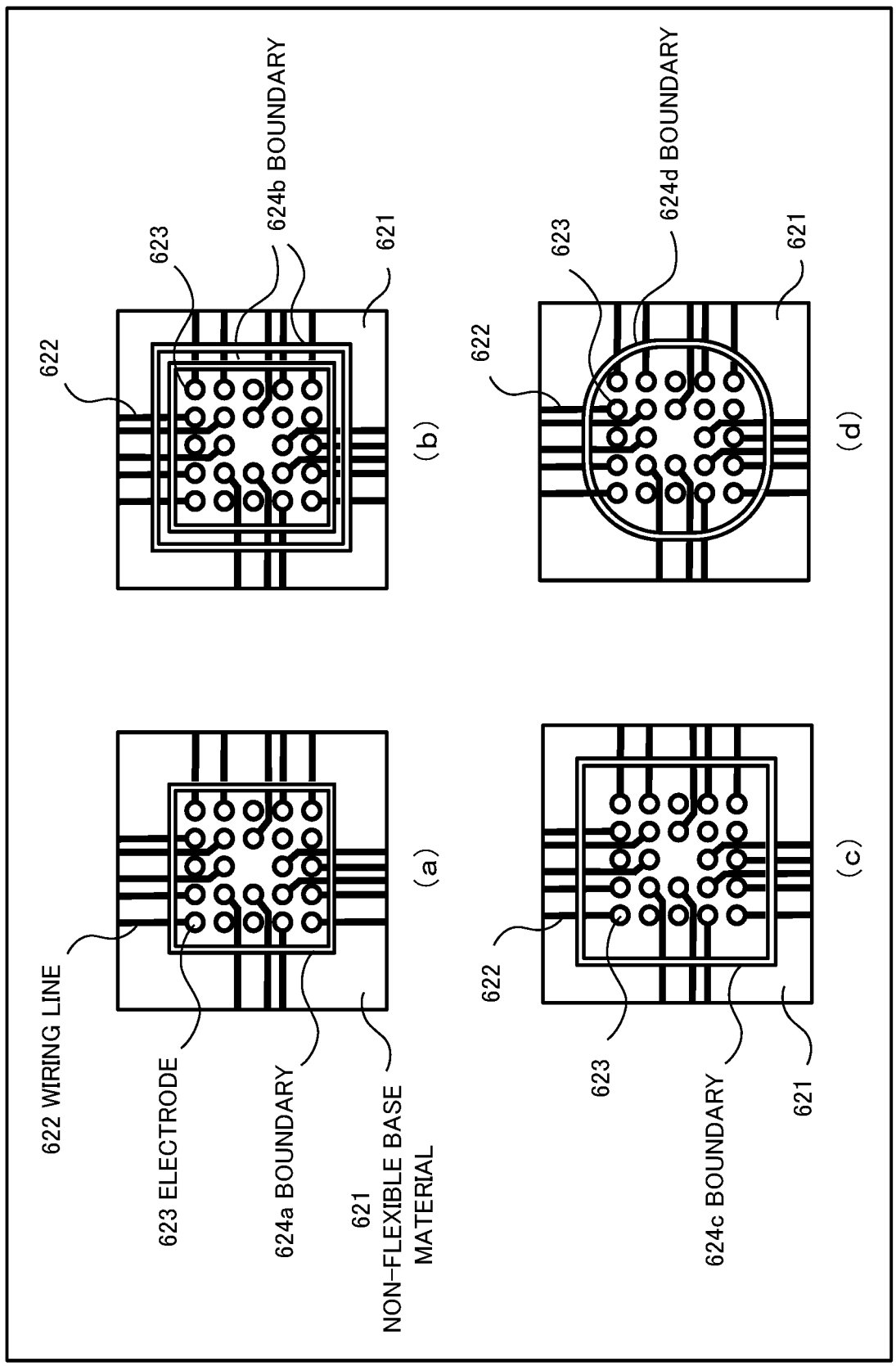
FIG. 16 is a plan view illustrating a specific example of a printed circuit board used in the electronic device according to the sixth example embodiment.

FIG. 16 is a plan view illustrating examples of an layout of the boundary provided to the non-flexible printed circuit board 620. In (a) of FIG. 16, a boundary 624a is formed to have a rectangle pattern surrounding a region provided with electrodes 623. In (b) of FIG. 16, a boundary 624b is formed to have a double rectangle pattern surrounding the region provided with the electrodes 623. In (c) of FIG. 16, a boundary 624c having a rectangle pattern is provided at a position away from the connection portions more outwardly than FIG. 16(a). In (d) of FIG. 16, a boundary 624d is formed to have an annular pattern surrounding the region provided with the electrodes 623. These boundaries may be formed by, for example, printing a resin on the surface of the non-flexible printed circuit board 620. Further, when solder resist is layered in the periphery of the electrodes 623, a boundary may be provided by layering a resin on the solder resist.

Further, instead of a protrusion, a boundary may be formed as a recessed portion by engraving solder resist or the like. Alternatively, a boundary may be formed by a coating film made of a material having a large contact angle with a protection resin. In this configuration, the coating film repels a protection resin, and can hinder an advance and limit a filling range of the protection resin. An layout of the coating film may be set similarly to FIG. 16, for example.

Note that the description on the boundary, which is given above, is applicable similarly to an FPC that is joined to the non-flexible printed circuit board 620.

As described above, according to the present example embodiment, the boundary can suppress excessive spreading of a protection resin, and the protection resin can be formed in a desired region.

Seventh Example Embodiment

Figure 17:
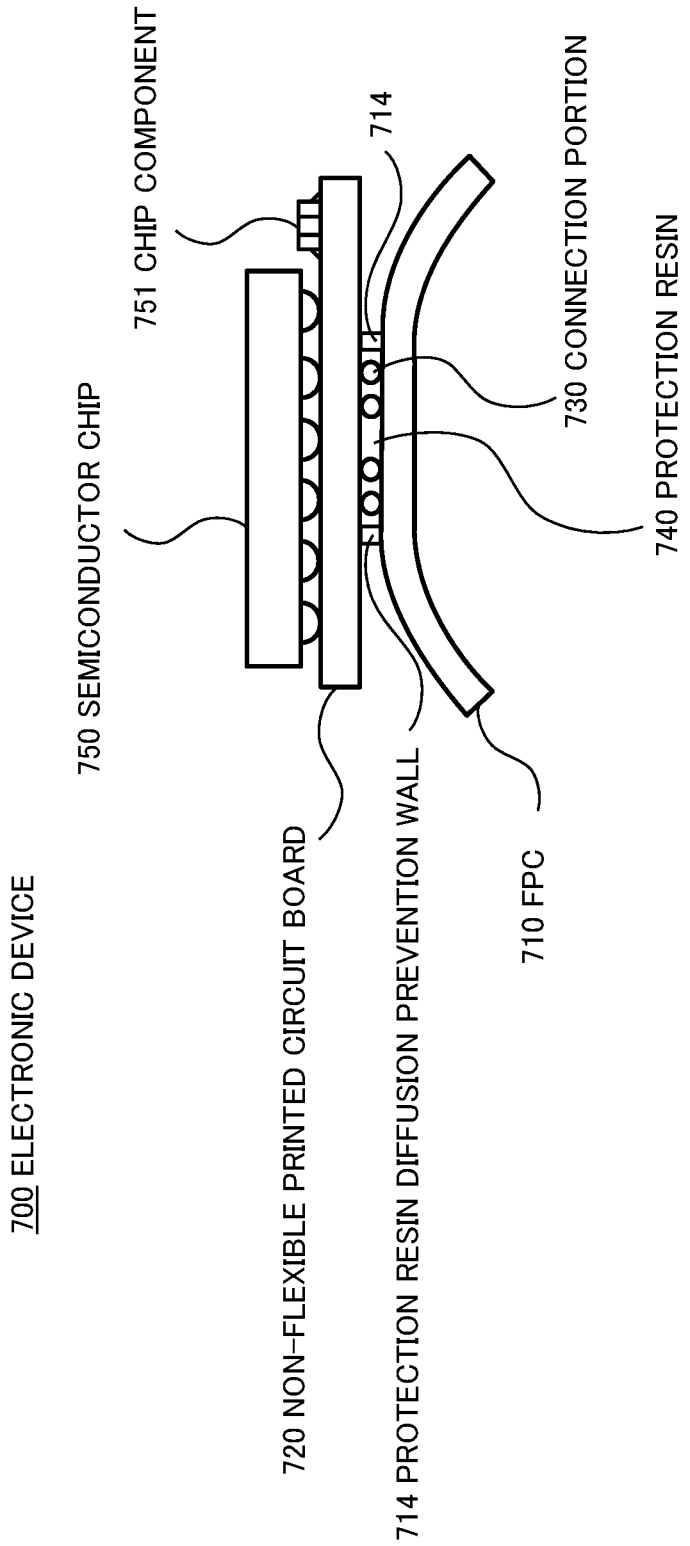
FIG. 17 is a cross-sectional view illustrating one example of an electronic device according to a seventh example embodiment.
Figure 18:
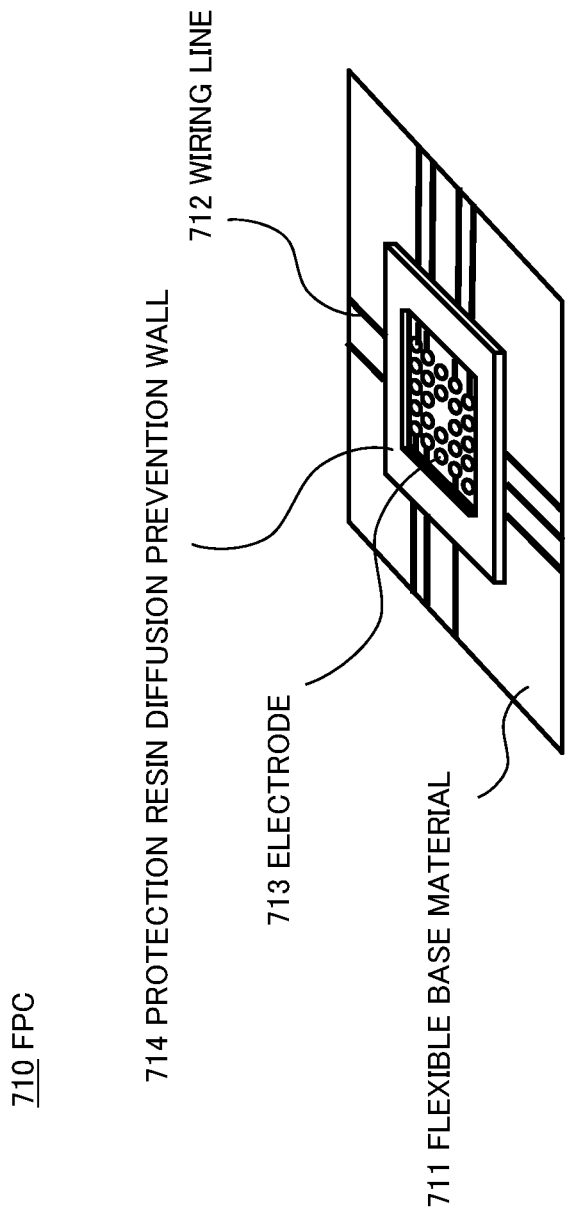
FIG. 18 is a perspective view illustrating an FPC used in the electronic device according to the seventh example embodiment.

In the sixth example embodiment, a formation region of the protection resin is limited by using the boundary formed of a protrusion portion or a recessed portion that is formed by a resin or the like, but spreading of the protection resin may be limited by using a firmer material. FIG. 17 is a cross-sectional view illustrating an electronic device 700 provided with a protection resin diffusion prevention wall 714 that prevents diffusion of a protection resin 740. Configurations of an FPC 710, a non-flexible printed circuit board 720, and a connection portion 730 are similar to those in the sixth example embodiment except that the protection resin diffusion prevention wall 714 is provided in place of the boundary in the sixth example embodiment. The protection resin diffusion prevention wall 714 is an annular solid body formed of a material such as metal or a heat-resistant resin. FIG. 18 is a perspective view illustrating the FPC 710 equipped with the protection resin diffusion prevention wall 714. The FPC 710 includes a flexible base material 711, wiring lines 712, and electrodes 713. As in FIG. 18, the protection resin diffusion prevention wall 714 is provided in a form surrounding a region in which the electrodes 713 are arranged. Note that, although not illustrated, injection of the protection resin may be performed by using a through hole similar to the third example embodiment, a groove similar to the fourth example embodiment, or the like.

The protection resin diffusion prevention wall 714 may be formed by using a solder material. When connection is performed by forming solder bumps on the FPC 710 or the non-flexible printed circuit board 720, the protection resin diffusion prevention wall 714 can be formed at the same time as the solder bumps. Formation of a solder pattern may be performed by using a printing method using a metal mask or the like, application through dispensing, a method of arranging solder in a molding state called a pre-form, or the like.

Note that the above-mentioned description is given by exemplifying the configuration in which the protection resin diffusion prevention wall is formed on the FPC, but is similarly applicable to the non-flexible printed circuit board 720.

Figure 19:
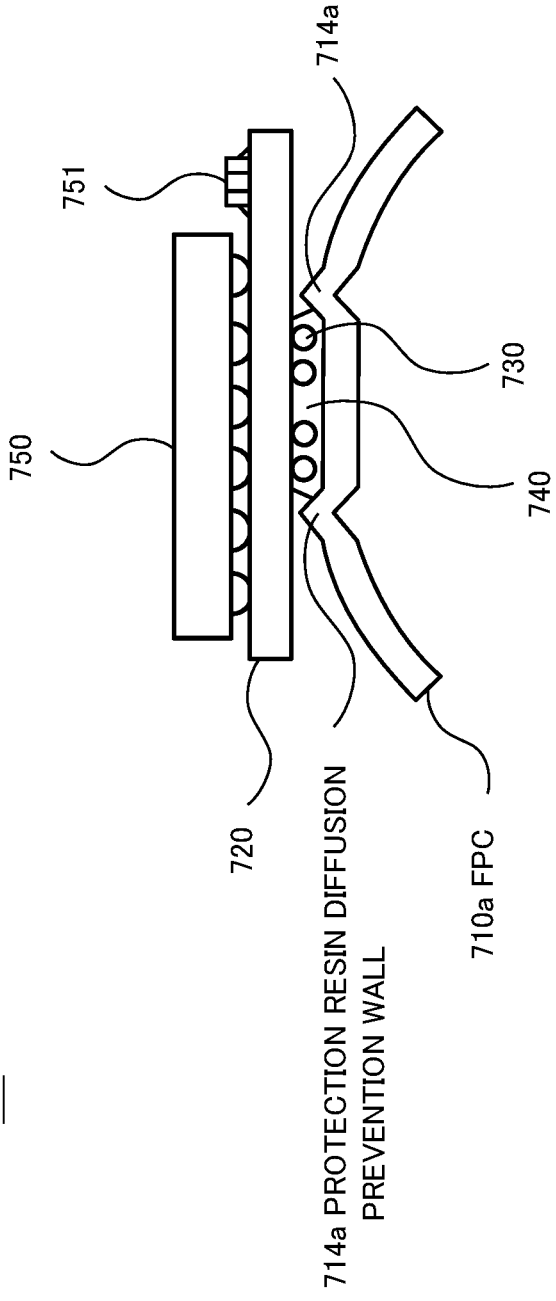
FIG. 19 is a cross-sectional view illustrating another example of the electronic device according to the seventh example embodiment.

Further, the protection resin diffusion prevention wall 714 may be formed by deforming a flexible base material forming an FPC through, for example, embossing or the like. FIG. 19 is a cross-sectional view illustrating an electronic device 701 in which an FPC 710a that includes a protection resin diffusion prevention wall 714a formed by raising a flexible base material and the non-flexible printed circuit board 720 are connected to each other. In this configuration, the protection resin diffusion prevention wall 714a stops diffusion of the protection resin, and limits a formation region of the protection resin within a desired range.

Figure 20:
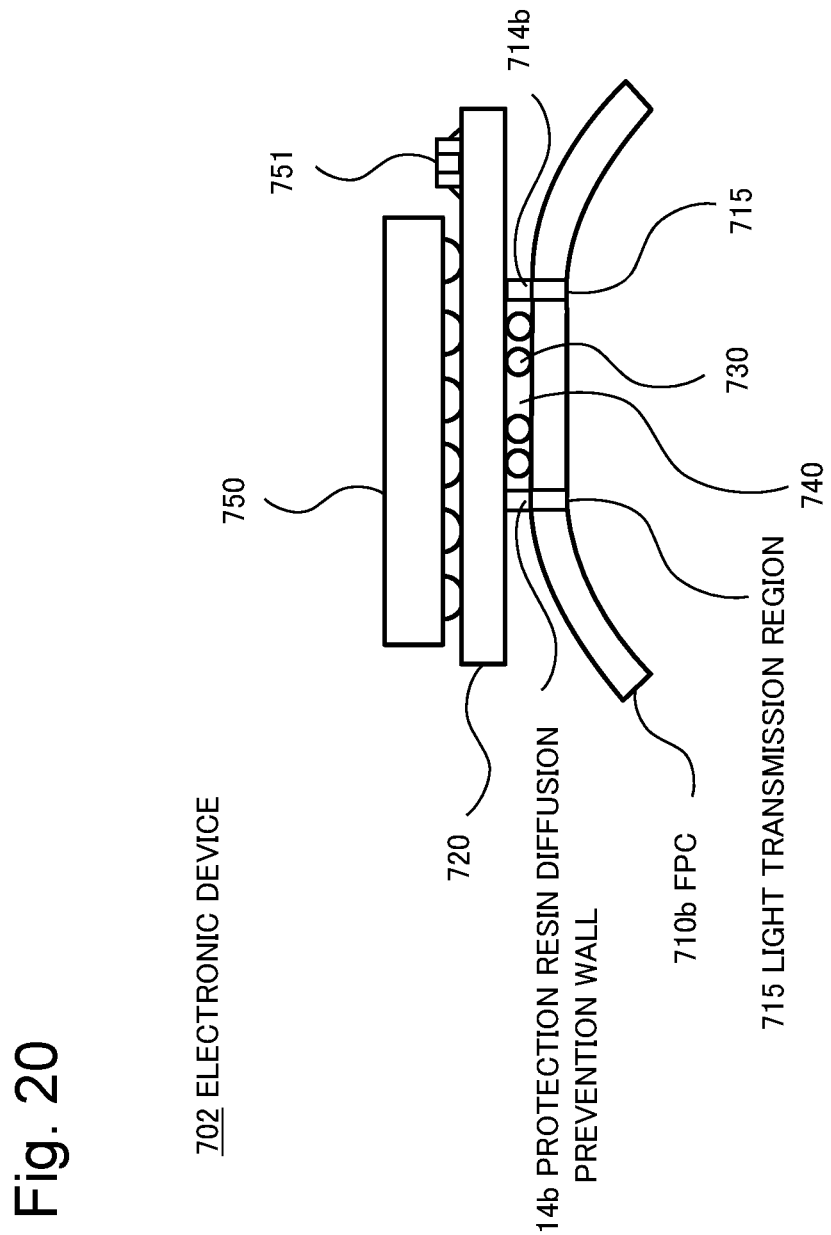
FIG. 20 is a cross-sectional view further illustrating another example of the electronic device according to the seventh example embodiment.
Figure 21:
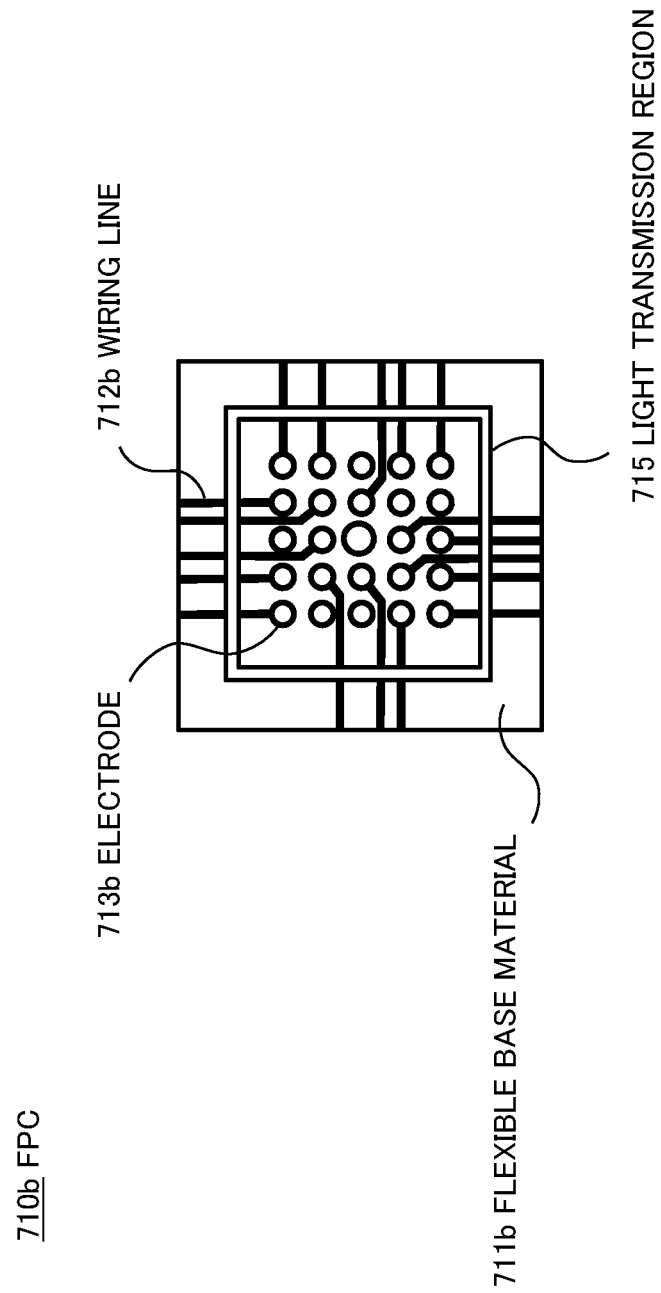
FIG. 21 is a plan view illustrating an FPC used in the electronic device according to the seventh example embodiment.

Further, the protection resin diffusion prevention wall may be formed by using a photosensitive resin. FIG. 20 is a cross-sectional view illustrating an electronic device 702 including a protection resin diffusion prevention wall 714b formed by using a photosensitive resin. An FPC 710b is provided with a light transmission region 715. The protection resin diffusion prevention wall 714b is cured by light passing through the light transmission region 715. FIG. 21 is a plan view illustrating the FPC 710b. The FPC 710b includes a flexible base material 711b, wiring lines 712b, and electrodes 713b. In addition to these, the light transmission region 715 that surrounds a region in which the electrodes 713b are formed is provided. The photosensitive resin is cured by light passing through the light transmission region 715, and the protection resin diffusion prevention wall 714b is formed. Note that, the light transmission region is only required to cause light that exposes the photosensitive resin to pass through, and is not necessarily required to be transparent with respect to visible light.

As described above, according to the present example embodiment, the protection resin diffusion prevention wall that prevents excessive spreading of a protection resin can be manufactured easily.

Eighth Example Embodiment

Figure 22:
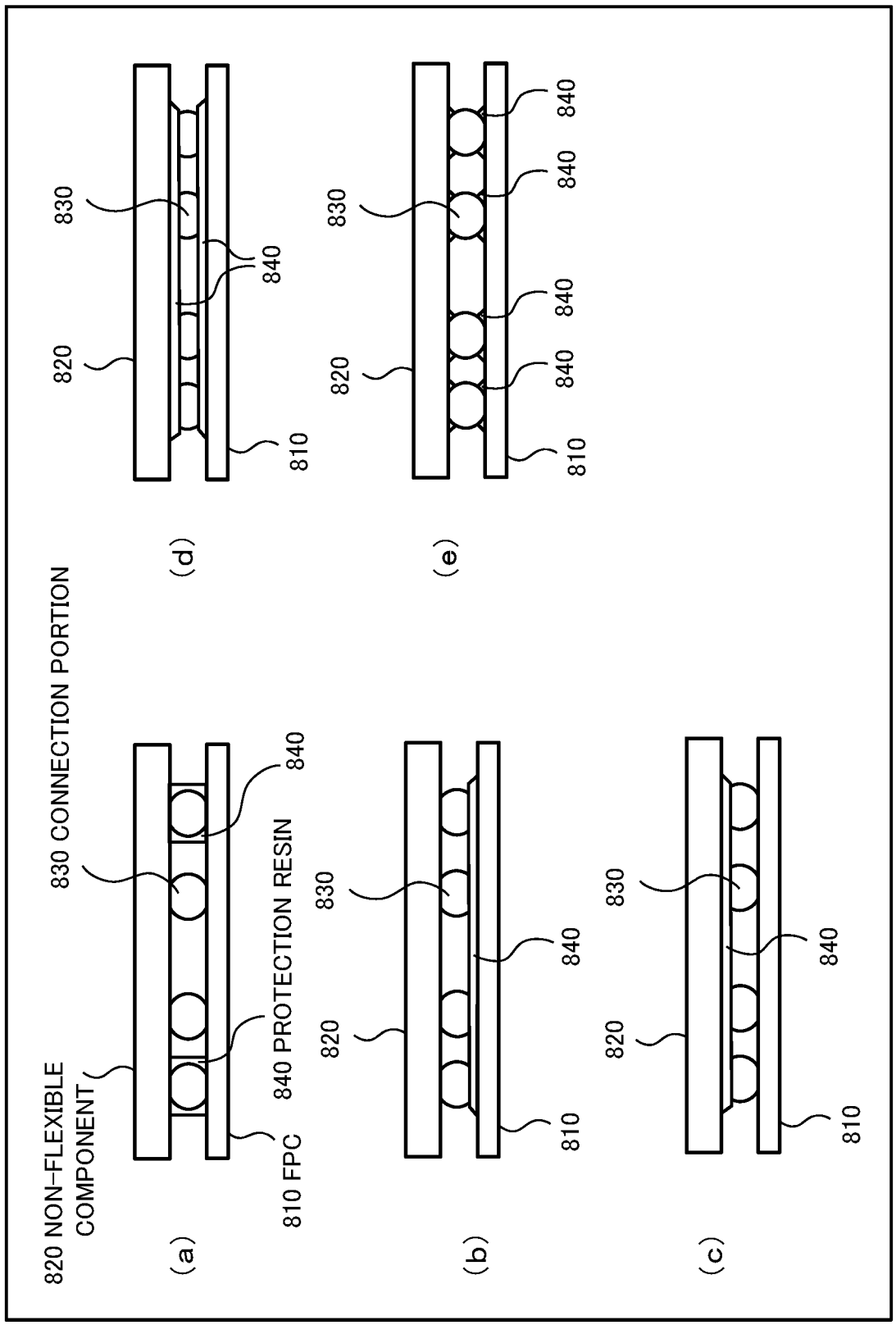
FIG. 22 is a cross-sectional view illustrating connection portions according to an eighth example embodiment.

In the first to seventh example embodiments, description is given on the configuration of filling the protection resin to the entire region provided with the connection portions, but the protection resin may protect part of the connection portions. FIG. 22 is a cross-sectional view illustrating a mounting structure in which an FPC 810 and a non-flexible component 820 are connected to each other with connection portions 830. (a) of FIG. 22 illustrates a configuration in which only the connection portions 830 that are arranged in the outer periphery are protected by a protection resin 840. (b) of FIG. 22 illustrates a configuration in which only sides of the connection portions 830, which are close to the FPC 810, are protected by the protection resin 840. (c) of FIG. 22 illustrates a configuration in which only sides of the connection portions 830, which are close to the non-flexible component 820, are protected by the protection resin 840. (d) of FIG. 22 illustrates a configuration in which only parts of the connection portions 830 in the vicinity of the FPC 810 and in the vicinity of the non-flexible component 820 are protected by the protection resin 840. (e) of FIG. 22 illustrates a configuration in which parts of the connection portions 830 in the vicinity of the FPC 810 and in the vicinity of the non-flexible component 820 are protected one by one by the protection resin 840. The mounting structures in which the connection portions are partially protected by the protection resin as described above can be manufactured.

Ninth Example Embodiment

Figure 23:
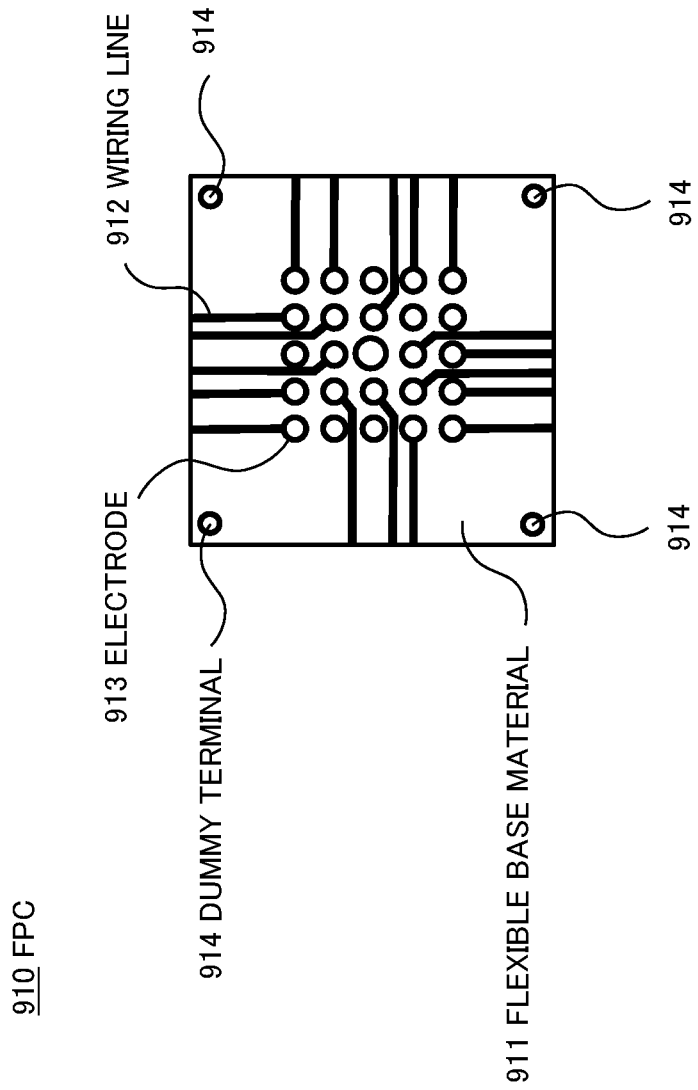
FIG. 23 is a plan view illustrating an FPC used in an electronic device according to a ninth example embodiment.

In an electronic device similar to the third to seventh example embodiments, on an outside of a region in which connection portions are formed, a projection portion that does not contribute to connection between a flexible circuit board and a non-flexible component may be formed as a dummy terminal. FIG. 23 is a plan view illustrating an FPC 910 provided with such dummy terminals 914. The FPC 910 includes a flexible base material 911, wiring lines 912, and electrodes 913.

Figure 24:
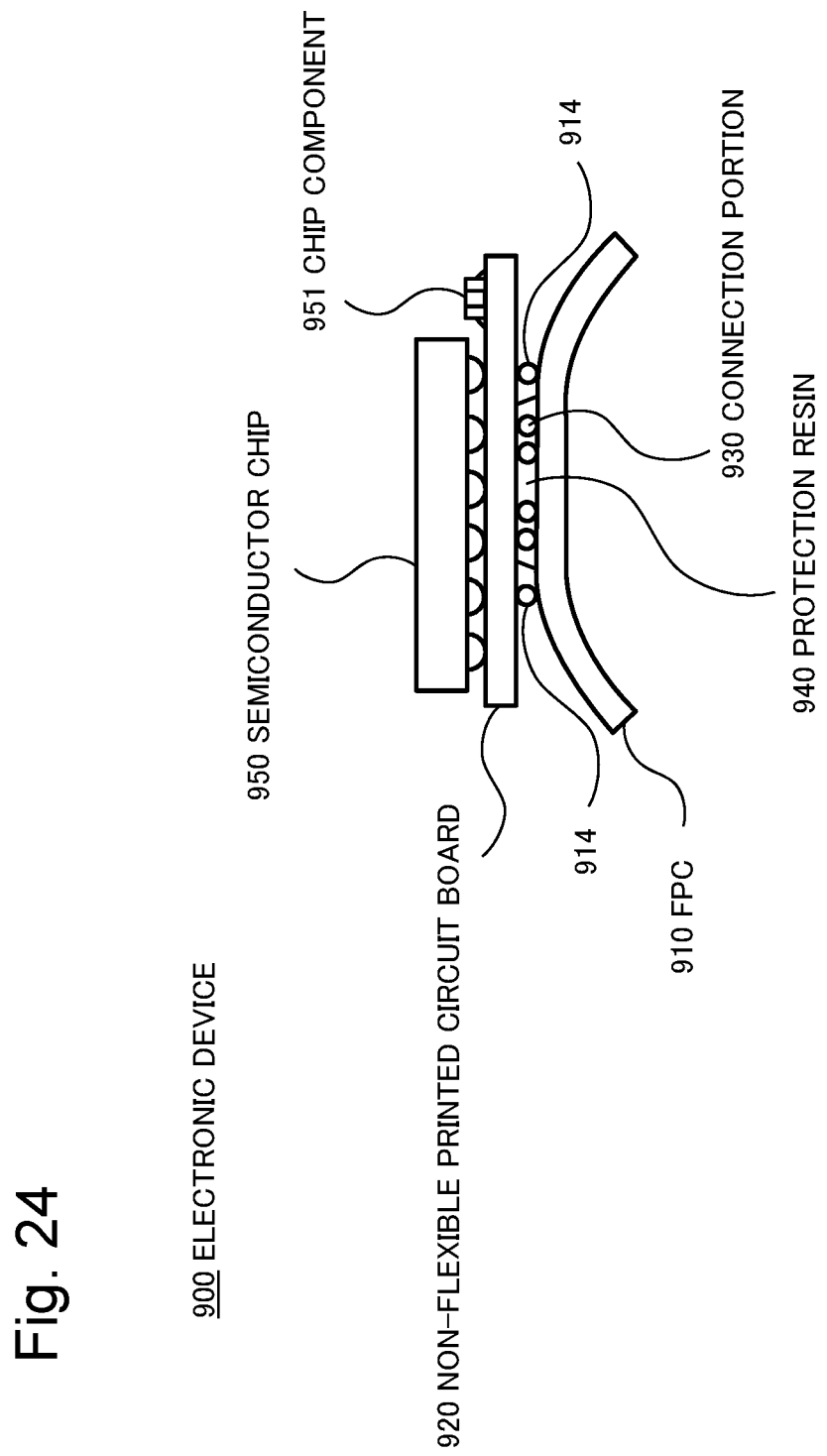
FIG. 24 is a cross-sectional view illustrating one example of the electronic device according to the ninth example embodiment.

FIG. 24 is a cross-sectional view illustrating an electronic device 911 in which the FPC 910 in FIG. 23 and a non-flexible printed circuit board 920 are connected to each other with connection portions 930. A protection resin 940 fills only a region provided with the connection portions, and does not fill the peripheries of the dummy terminals 914. The dummy terminals 914 as described above function as spacers securing an interval between the non-flexible printed circuit board 920 and the FPC 910, and supports the FPC 910 to be separated from the non-flexible printed circuit board 920 on an outside of the region provided with the connection portions 930.

Tenth Example Embodiment

Figure 25:
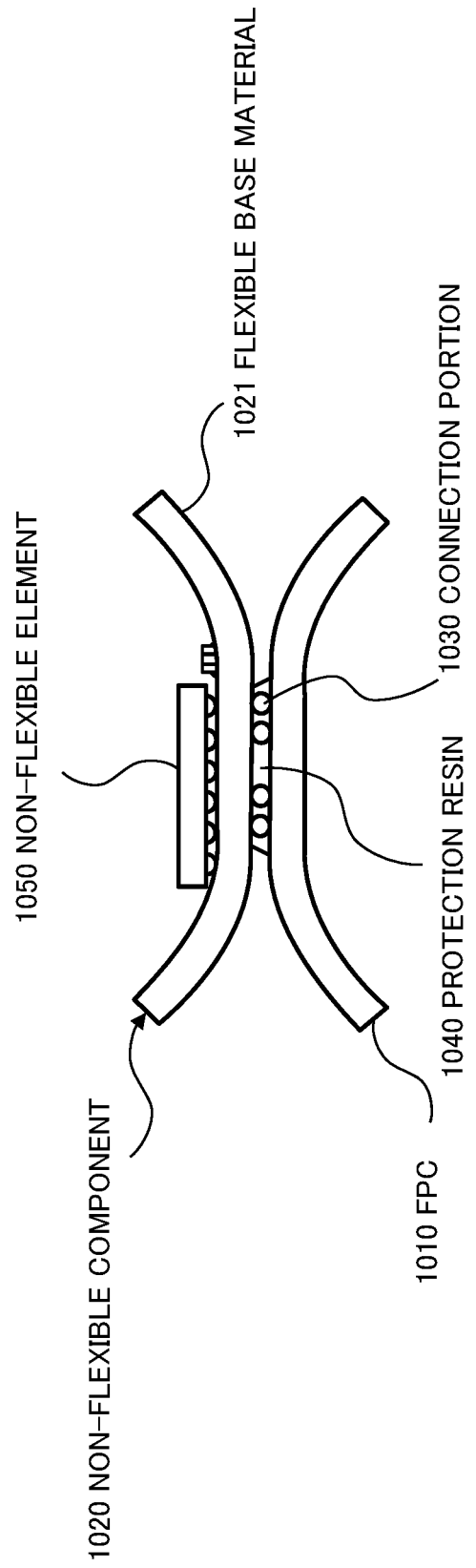
FIG. 25 is a cross-sectional view illustrating one example of an electronic device according to a tenth example embodiment.

In a case where a non-flexible component is equipped to a base material, even if the base material is a flexible FPC, the equipped part is non-flexible, which is required to be dealt with as a non-flexible component. FIG. 25 is a cross-sectional view illustrating an electronic device in which a non-flexible component 1020 and an FPC 1010 are connected to each other. A base material 1021 is equipped with a non-flexible element 1050, and the equipped part is non-flexible, which also makes the non-flexible component 1020 non-flexible. A region provided with connection portions 1030 and a region in which a protection resin 1040 covering those are set to be smaller than a bottom surface of the non-flexible element 1050, and hence an electronic device that improves followability to a curved surface can be configured as compared to a case where the non-flexible component 1020 is used as it is.

Eleventh Example Embodiment

A gap holding jig may be used when a protection resin fills a space between connection portions of an electronic device in which a flexible circuit board and a non-flexible component are connected to each other. The gap holding jig supports filling work of the protection resin only in the vicinity of the connection portions while maintaining a state in which the flexible circuit board and the non-flexible component are separable from each other.

Figure 26:
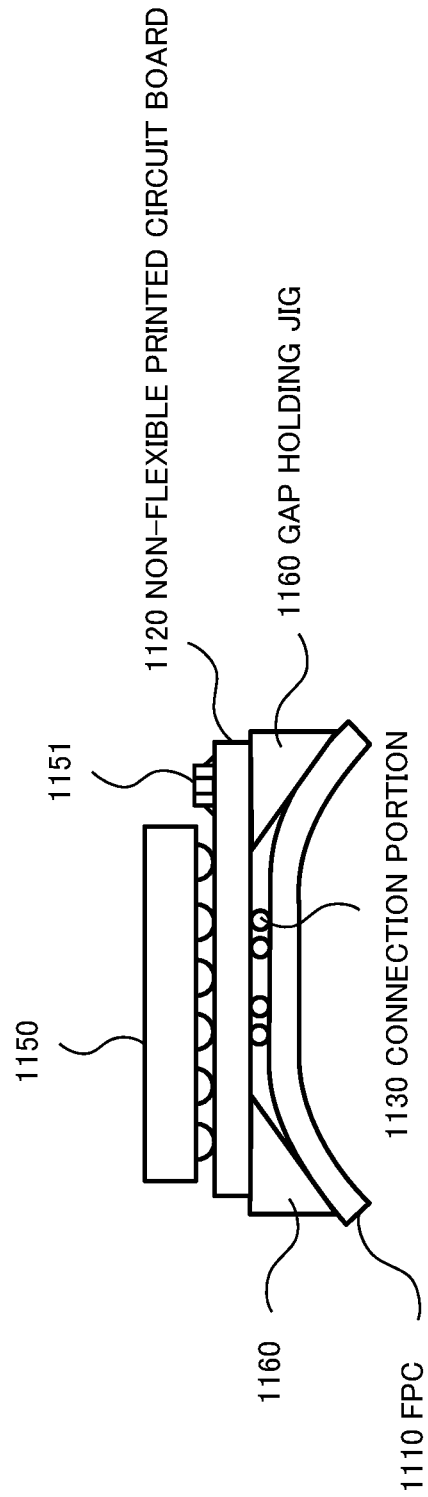
FIG. 26 is a cross-sectional view illustrating one example of a gap holding jig according to an eleventh example embodiment.

FIG. 26 is a cross-sectional view illustrating one example of a gap holding jig 1160. The gap holding jig 1160 maintains a state in which an FPC 1110 is separated from a non-flexible printed circuit board 1120, on an outside of a region provided with connection portions 1130. Note that it is assumed that the FPC 1110 and the non-flexible printed circuit board 1120 are connected and fixed to each other in advance with the connection portions 1130. While this state is maintained, the region provided with the connection portions 1130 is filled with the protection resin. Further, after the protection resin is cured, the gap holding jig 1160 is removed. In this manner, an electronic device in which the FPC 1110 is separable from the non-flexible printed circuit board 1120 on the outside of the connection portions 1130 can be manufactured easily and securely by using the gap holding jig 1160.

Figure 27:
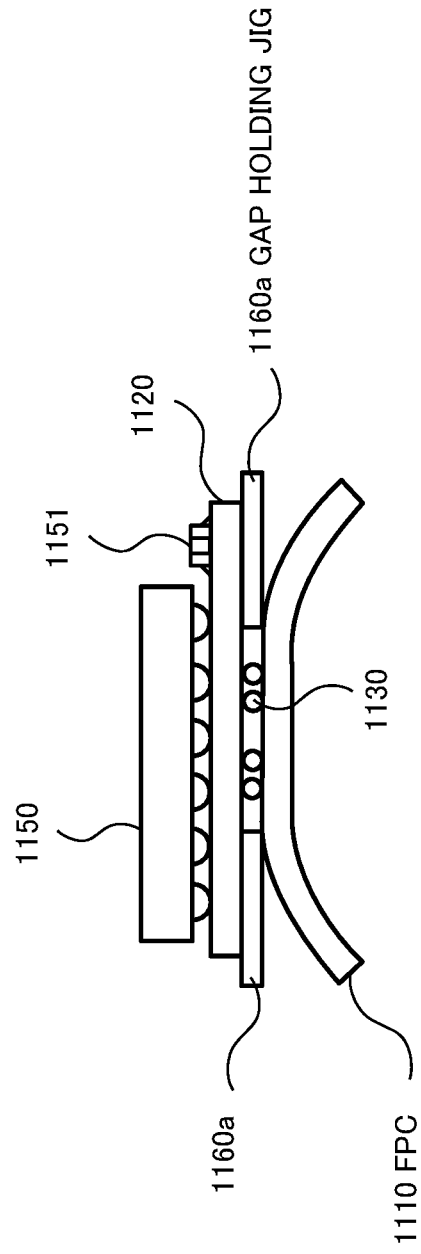
FIG. 27 is a cross-sectional view illustrating another example of the gap holding jig according to the eleventh example embodiment.

FIG. 27 is a cross-sectional view illustrating another example of the gap holding jig. A gap holding jig 1160*a* in FIG. 27 has a plate-like shape. The gap holding jig 1160*a* is inserted to the vicinity of the connection portions 1130, and a state in which the FPC 1110 is separated from the non-flexible printed circuit board 1120 is maintained. Further, the protection resin fills the region provided with the connection portions 1130, and is cured. Similarly to the case in FIG. 26, even when the gap holding jig 1160*a* described above is used, an electronic device in which the FPC 1110 is separable from the non-flexible printed circuit board 1120 on the outside of the connection portions 1130 can be manufactured easily and securely.

Figure 28:
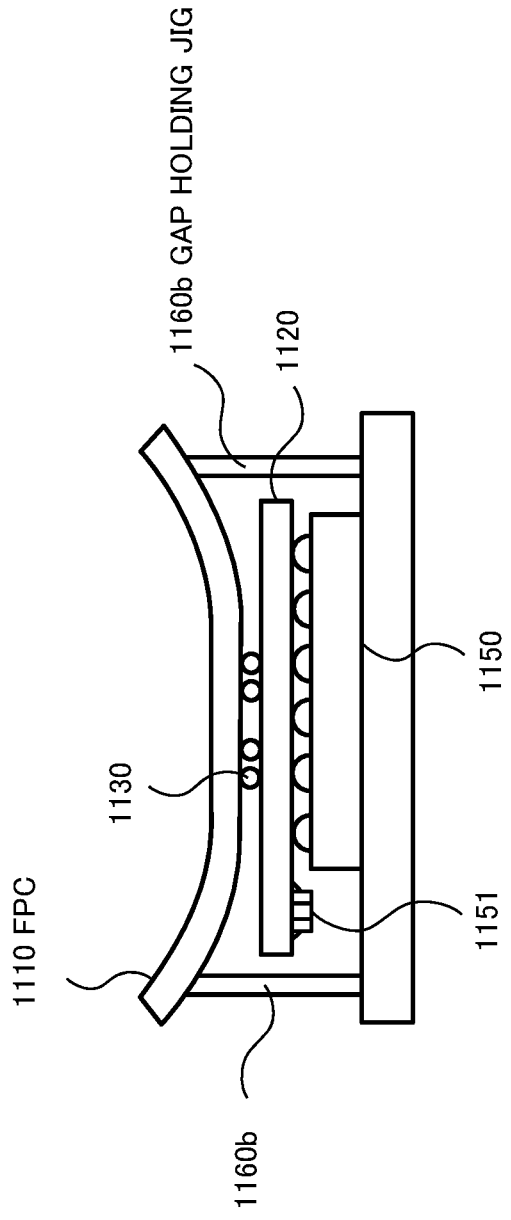
FIG. 28 is a cross-sectional view further illustrating another example of the gap holding jig according to the eleventh example embodiment.

FIG. 28 is a cross-sectional view further illustrating another example of the gap holding jig. A gap holding jig 1160*b* in FIG. 28 maintains a state in which the outside of the connection portions 1130 of the FPC 1110 is pushed upward when the non-flexible printed circuit board 1120 is placed on a lower side, and the FPC 1110 is placed on an upper side. When filling of the protection resin to the connection portions 1130 and curing are performed under this state, an electronic device in which the FPC 1110 is separable from the non-flexible printed circuit board 1120 on the outside of the connection portions 1130 can be manufactured.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

The whole or part of the example embodiments disclosed above can be described as, but not limited to, the following supplementary notes.

(Supplementary Note 1)
A mounting structure, comprising:
a flexible circuit board;
a non-flexible component;
a connection portion configured to connect the flexible circuit board and the non-flexible component to each other, the connection portion being provided on a bottom surface of the non-flexible component and provided within a region smaller than the bottom surface; and
a protection resin configured to seal the connection portion on an outside of the connection portion in such a way that the flexible circuit board and the non-flexible component are separable from each other.

(Supplementary Note 2)
The mounting structure according to supplementary note 1, wherein
either one of the flexible circuit board and the non-flexible component has a through hole in a vicinity of a center of a region being provided with the connection portion.

(Supplementary Note 3)
The mounting structure according to supplementary note 1 or 2, wherein
either one of the flexible circuit board and the non-flexible component has a groove communicating with a region being provided with the connection portion from an own end.

(Supplementary Note 4)
The mounting structure according to any one of supplementary notes 1 to 3, wherein
at least one of the flexible circuit board and the non-flexible component has a boundary being formed of a protrusion portion or a recessed portion that surrounds a region being provided with the connection portion.

(Supplementary Note 5)
The mounting structure according to any one of supplementary notes 1 to 4, wherein
at least one of the flexible circuit board and the non-flexible component has a projection portion on an outside of a region being provided with the connection portion, the projection portion being not covered with the protection resin regardless of connection between the flexible circuit board and the non-flexible component.

(Supplementary Note 6)
An electronic device, comprising:
the mounting structure according to any one of supplementary notes 1 to 5; and
an electronic component being equipped on the non-flexible component.

(Supplementary Note 7)
A manufacturing method of a mounting structure, comprising:
connecting a flexible circuit board and a non-flexible component to each other with a connection portion that is provided on a bottom surface of the non-flexible component and provided within a region smaller than the bottom surface; and
sealing the connection portion with a protection resin on an outside of the connection portion in such a way that the flexible circuit board and the non-flexible component are separable from each other.

(Supplementary Note 8)
The manufacturing method of a mounting structure according to supplementary note 7, the method further comprising:
in either one of the flexible circuit board and the non-flexible component, forming a through hole in a vicinity of a center of a region being provided with the connection portion; and
filling the protection resin through the through hole.

(Supplementary Note 9)
The manufacturing method of a mounting structure according to supplementary note 7 or 8, the method further comprising:
in either one of the flexible circuit board and the non-flexible component, forming a groove communicating with a region being provided with the connection portion from an own end; and filling the protection resin through the groove.

(Supplementary Note 10)
The manufacturing method of a mounting structure according to any one of supplementary notes 7 to 9, the method further comprising,
in at least one of the flexible circuit board and the non-flexible component, forming a boundary being formed of a protrusion portion or a recessed portion that surrounds a region being provided with the connection portion.

(Supplementary Note 11)
The manufacturing method of a mounting structure according to any one of supplementary notes 7 to 10, the method further comprising,
in at least one of the flexible circuit board and the non-flexible component, forming a dummy terminal on an outside of a region being provided with the connection portion, the dummy terminal being not covered with the protection resin regardless of connection.

(Supplementary Note 12)
A manufacturing method of an electronic device, comprising:
manufacturing the mounting structure by the manufacturing method of a mounting structure according to any one of supplementary notes 7 to 11; and
equipping an electronic component on the non-flexible component.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty.

Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:
1. A mounting structure, comprising:
a flexible circuit board;
a non-flexible component;
a connection portion configured to connect the flexible circuit board and the non-flexible component to each other, the connection portion being provided on a bottom surface of the non-flexible component and provided within a region smaller than the bottom surface; and
a protection resin configured to seal the connection portion in such a way that the flexible circuit board and the non-flexible component are separable from each other outside of the connection portion.
2. The mounting structure according to claim 1, wherein either one of the flexible circuit board and the non-flexible component has a through hole in a vicinity of the center of the connection portion.

3. The mounting structure according to claim 2, wherein either one of the flexible circuit board and the non-flexible component has a groove communicating with a region being provided with the connection portion from an own end.

4. The mounting structure according to claim 2, wherein at least one of the flexible circuit board and the non-flexible component has a boundary being formed of a protrusion portion or a recessed portion that surrounds a region being provided with the connection portion.

5. The mounting structure according to claim 2, wherein at least one of the flexible circuit board and the non-flexible component has a projection portion on an outside of a region being provided with the connection portion, the projection portion being not covered with the protection resin regardless of connection between the flexible circuit board and the non-flexible component.

6. An electronic device, comprising:
the mounting structure according to claim 2; and
an electronic component that is equipped on the non-flexible component.

7. The mounting structure according to claim 1, wherein either one of the flexible circuit board and the non-flexible component has a groove communicating with a region being provided with the connection portion from an own end.

8. The mounting structure according to claim 7, wherein at least one of the flexible circuit board and the non-flexible component has a boundary being formed of a protrusion portion or a recessed portion that surrounds a region being provided with the connection portion.

9. The mounting structure according to claim 7, wherein at least one of the flexible circuit board and the non-flexible component has a projection portion on an outside of a region being provided with the connection portion, the projection portion being not covered with the protection resin regardless of connection between the flexible circuit board and the non-flexible component.

10. An electronic device, comprising:
the mounting structure according to claim 7; and
an electronic component that is equipped on the non-flexible component.

11. The mounting structure according to claim 1, wherein at least one of the flexible circuit board and the non-flexible component has a boundary being formed of a protrusion portion or a recessed portion that surrounds a region being provided with the connection portion.

12. The mounting structure according to claim 11, wherein at least one of the flexible circuit board and the non-flexible component has a projection portion on an outside of a region being provided with the connection portion, the projection portion being not covered with the protection resin regardless of connection between the flexible circuit board and the non-flexible component.

13. An electronic device, comprising:
the mounting structure according to claim 11; and
an electronic component that is equipped on the non-flexible component.

14. The mounting structure according to claim 1, wherein at least one of the flexible circuit board and the non-flexible component has a projection portion on an outside of a region being provided with the connection portion, the projection portion being not covered with the protection resin regardless of connection between the flexible circuit board and the non-flexible component.

15. An electronic device, comprising:
the mounting structure according to claim 1; and
an electronic component that is equipped on the non-flexible component.

16. An electronic device, comprising:
the mounting structure according to claim 14; and
an electronic component that is equipped on the non-flexible component.

17. A manufacturing method of a mounting structure, comprising:
connecting a flexible circuit board and a non-flexible component to each other with a connection portion that is provided on a bottom surface of the non-flexible component and provided within a region smaller than the bottom surface; and
sealing the connection portion with a protection resin in such a way that the flexible circuit board and the non-flexible component are separable from each other outside of the connection portion.

18. The manufacturing method of a mounting structure according to claim 17, the method further comprising:
in either one of the flexible circuit board and the non-flexible component, forming a through hole in a vicinity of the center of the connection portion; and
filling the protection resin into the connection portion through the through hole.

19. The manufacturing method of a mounting structure according to claim 17, the method further comprising:
in either one of the flexible circuit board and the non-flexible component, forming a groove communicating with a region being provided with the connection portion from an own end; and
filling the protection resin into the connection portion through the groove.

20. A manufacturing method of an electronic device, comprising:
manufacturing the mounting structure by the manufacturing method of a mounting structure according to claim 17; and
equipping an electronic component on the non-flexible component.

* * * * *